United States Patent [19]

Shiratake et al.

[11] Patent Number: 5,555,203

[45] Date of Patent: Sep. 10, 1996

[54] DYNAMIC SEMICONDUCTOR MEMORY DEVICE

[75] Inventors: Shinichiro Shiratake, Tokyo; Kazunori Ohuchi, Yokohama; Daisaburo Takashima, Kawasaki, all of Japan

[73] Assignee: Kabushiki Kaisha Toshiba, Kawasaki, Japan

[21] Appl. No.: 358,582

[22] Filed: Dec. 19, 1994

[30] Foreign Application Priority Data

Dec. 28, 1993 [JP] Japan .................................. 5-349074
Dec. 28, 1993 [JP] Japan .................................. 5-354208
Jun. 22, 1994 [JP] Japan .................................. 6-140353

[51] Int. Cl.$^6$ .................................................. G11C 7/00
[52] U.S. Cl. .............................. 365/51; 365/63; 365/206
[58] Field of Search .................................. 365/51, 63, 149, 365/207, 190, 69, 189.01, 206

[56] References Cited

U.S. PATENT DOCUMENTS

| 4,807,194 | 2/1989 | Yamada et al. ............................. 365/51 |
| 4,872,142 | 10/1989 | Hannai ....................................... 365/51 |
| 5,014,241 | 5/1991 | Asakura et al. ............................ 365/51 |
| 5,369,612 | 11/1994 | Furuyama .............................. 365/189.05 |
| 5,418,750 | 5/1995 | Shiratake et al. .......................... 365/206 |

OTHER PUBLICATIONS

Takehiro Hasegawa, et al., "An Experimental DRAM with a HAND-Structured Cell", ISSCC 93 Digest of Technical Papers, Feb. 24, 1993 pp. 46-47.

Primary Examiner—Joseph A. Popek
Attorney, Agent, or Firm—Oblon, Spivak, McClelland, Maier, & Neustadt, P.C.

[57] ABSTRACT

A NAND type DRAM includes a plurality of NAND cells disposed on intersections between a plurality of word lines and a plurality of bit lines, a plurality of sense amplifiers each for sensing and amplifying the potential difference between two bit lines of each bit line pair among the plurality of bit lines, first switching sections for sequentially selecting those bit lines of the plurality of bit lines which are connected to the sense amplifier in a paired form, and second switching sections for sequentially changing the combination of a bit line pair constructed by bit lines selected by the first switching sections, and two bit lines disposed adjacent to and on both sides of a bit line to which the NAND cell is electrically connected are connected to the sense amplifier in a paired form by the first and second switching sections.

17 Claims, 19 Drawing Sheets

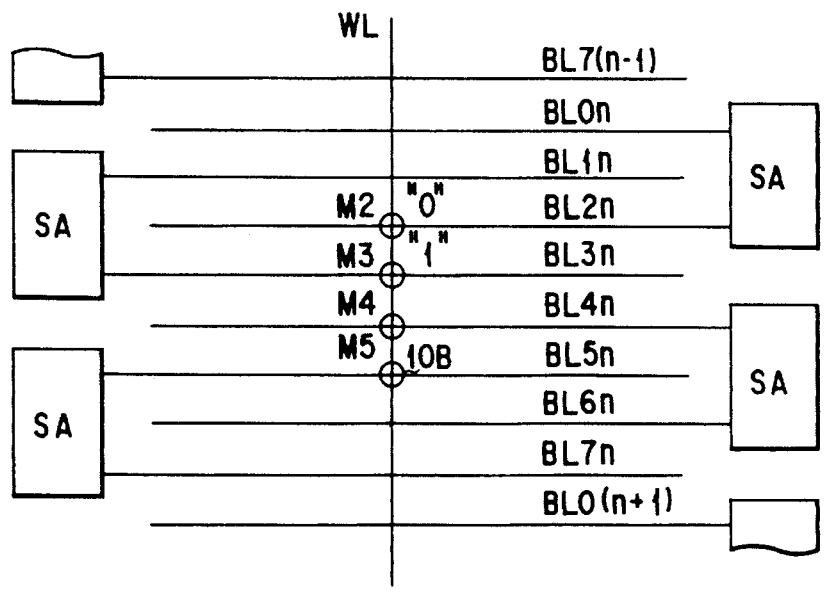
F I G. 10A
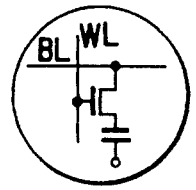
F I G. 10B

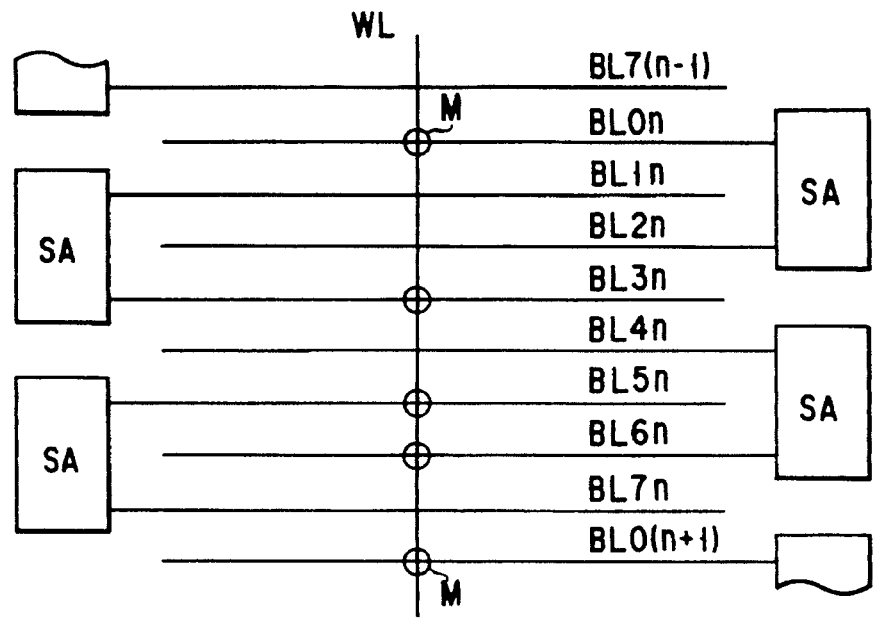
F I G. 13
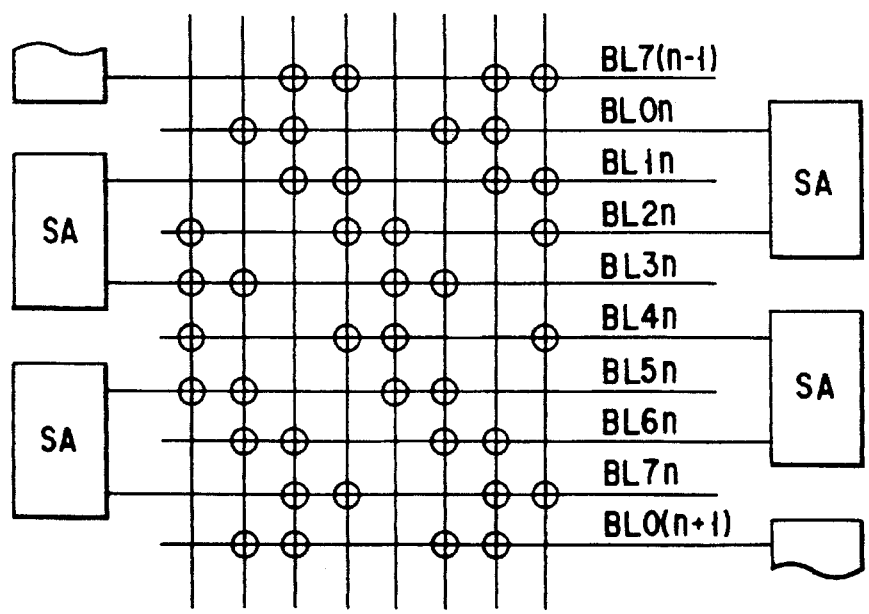
F I G. 14

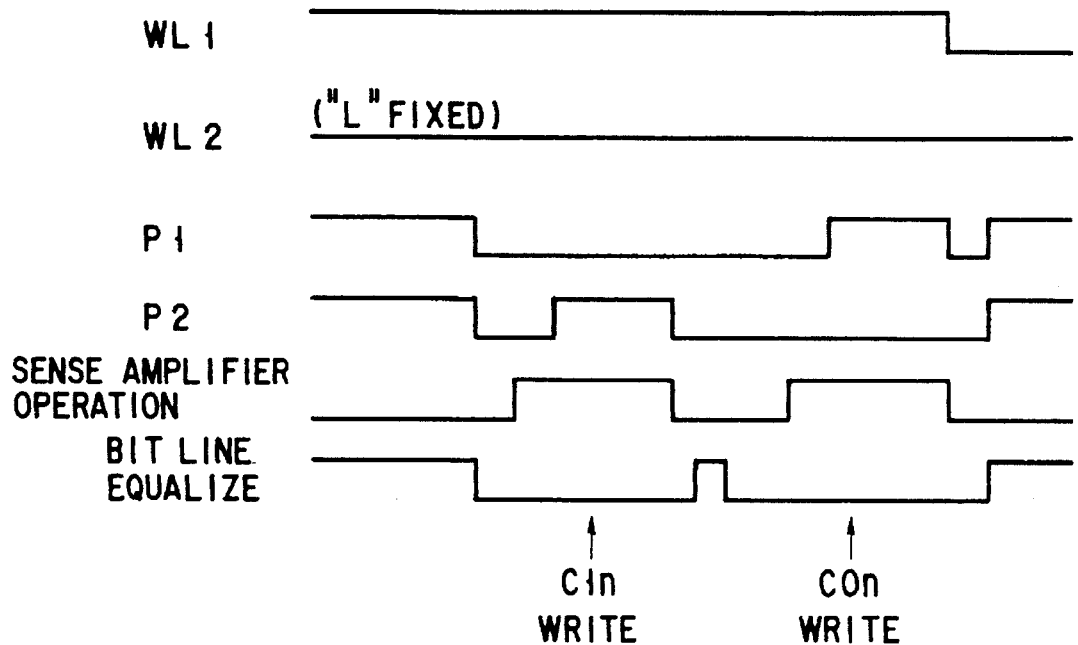
F I G. 18
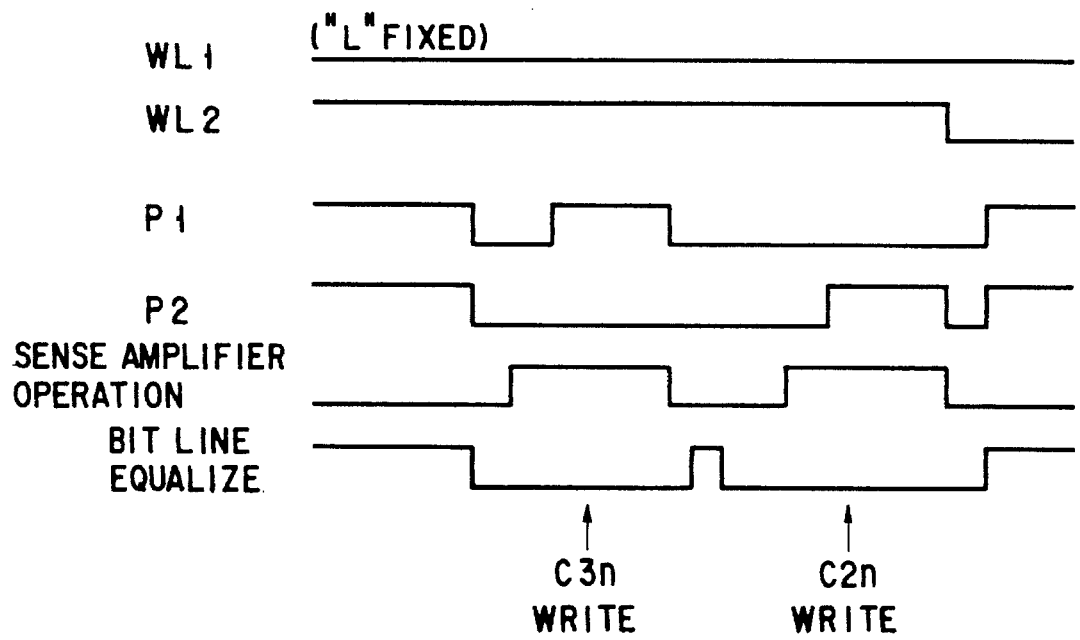
F I G. 19

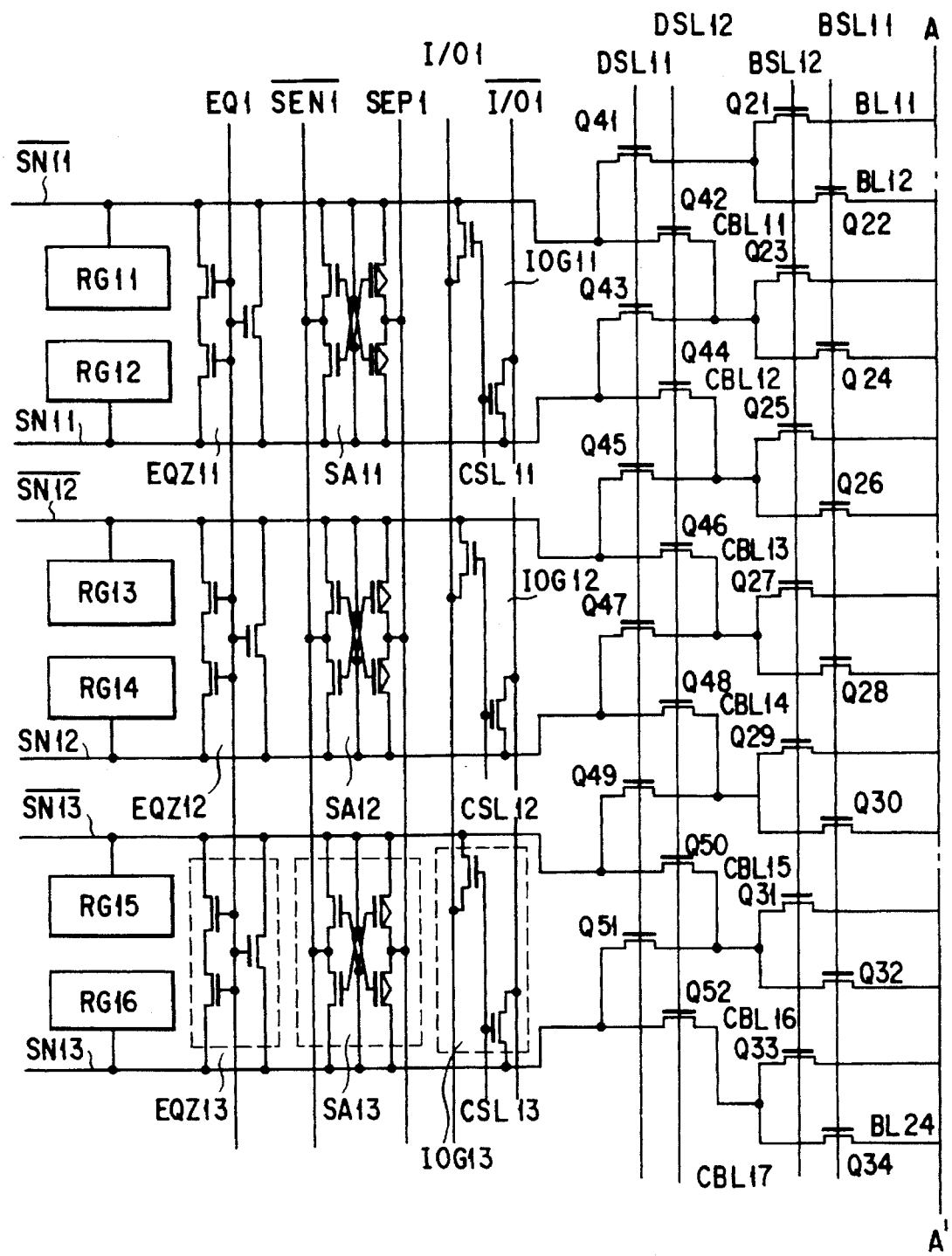
F I G. 23

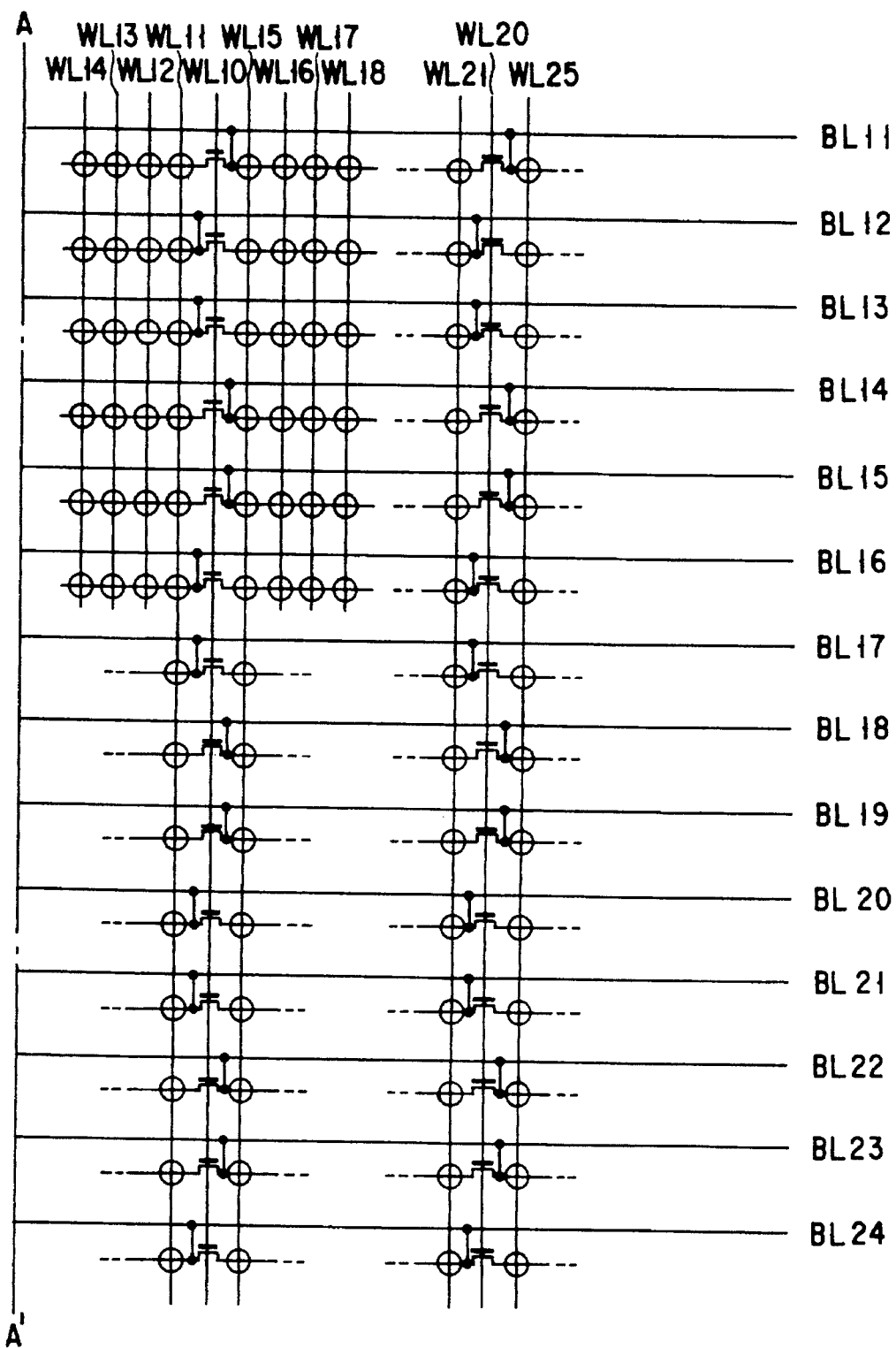
F I G. 24

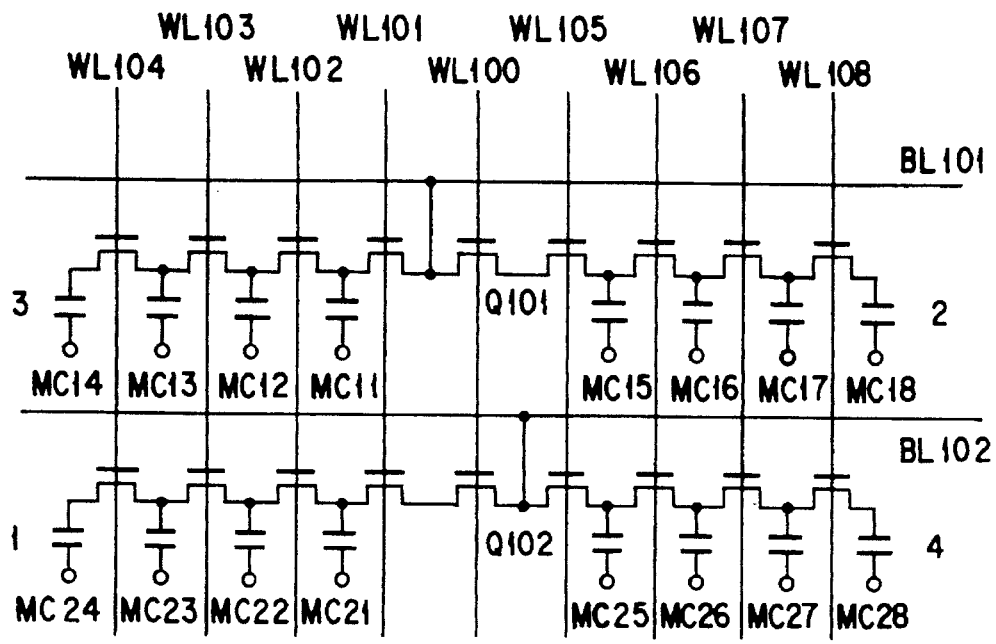
F I G. 25
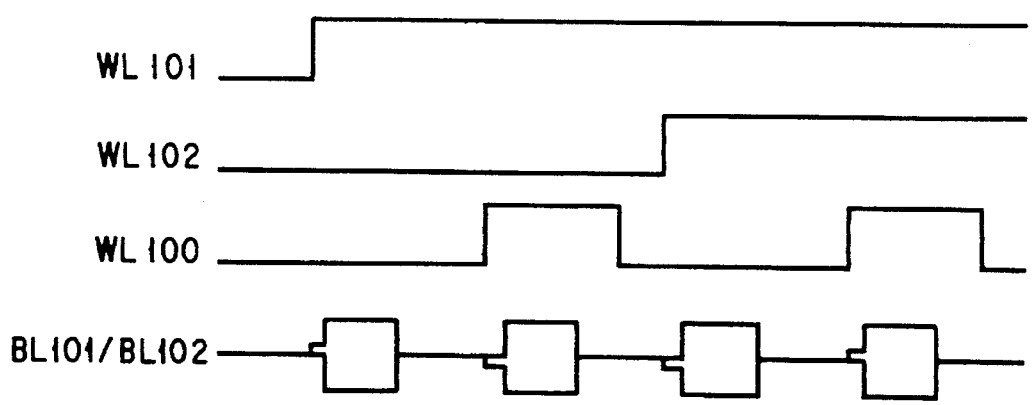
F I G. 26

DYNAMIC SEMICONDUCTOR MEMORY DEVICE

BACKGROUND OF THE INVENTION

1. Field of the Invention

This invention relates to a dynamic semiconductor memory device, and more particularly to a dynamic semiconductor memory device in which the interference noises between bit lines is suppressed.

2. Description of the Related Art

In recent years, the size of each memory cell is reduced and the interval between the bit lines is made shorter as the integration capacity of the semiconductor memory device becomes larger. As a result, readout noises due to the capacitive coupling between the bit lines become so large that they cannot be neglected. This problem is explained with reference to the accompanying drawings.

FIG. 1 shows an example of an arrangement of a dynamic semiconductor memory device of folded bit line configuration, BL denotes a bit line, WL denotes a word line, M denotes a memory cell, and SA denotes a sense amplifier. A case wherein the word line WL1 in FIG. 1 is selected is explained below.

FIG. 2 is a diagram showing a case where much attention is paid only to the word line WL1 in FIG. 1. When WL1 is selected, data of selected memory cells M are transferred to bit lines and the potentials of BL0m, BL3m (m = - - -, n−1, n, n+1, - - -) are changed by a signal voltage amplitude of +Vs or −Vs according to data of "1" or "0".

The bit lines give a small potential deviation to adjacent bit lines by the capacitive coupling between bit lines and the magnitude thereof is Vs×CBB/CB. CBB is a coupling capacitance between the adjacent two bit lines and CB is a capacitance of the bit line to the ground.

Assume now that "1" is stored in the memory cell M0n, "1" is stored in the memory cell M3n, and "0" is stored in the memory cell M3 (n−1). In this case, since data of M0n is "1" and the potential of the bit line BL3 (n−1) is changed by −Vs, the potential of the bit line BL0n is changed by a combination of the signal and noise by an amount expressed as follows.

$$dV(BL0n)=Vs-Vs\times CBB/CB$$

Further, since the potential of the adjacent bit line BL3n is changed by +Vs, the potential of BL2n which is a reference bit line of the bit line BL0n is changed by an amount expressed as follows.

$$dV(BL2n)=+Vs\times CBB/CB$$

Therefore, the potential difference between BL0n and BL2n can be derived as follows.

$$dV(BL0n)-dV(BL2n)=Vs-2Vs\times CBB/CB$$

The second term of the above equation indicates a noise component by the capacitive coupling between the bit lines. The above equation indicates that the relative value of noise to the unit signal becomes 2CBB/CB.

Therefore, in the dynamic semiconductor memory device shown in FIG. 1, the ratio of the noise to the signal is set to 2CBB/CB by the capacitive coupling between the bit lines, thereby causing the operation margin of a circuit such as a sense amplifier to be reduced.

On the other hand, as the pitch of the bit lines becomes smaller, the pitch of sense amplifiers also becomes smaller, and therefore, a method for sharing a sense amplifier with a plurality of bit line pairs so as to increase the pitch of the sense amplifier sections is proposed. Thereby, deceasing the area occupied by the sense amplifier on a chip surface, a total chip area becomes smaller. However, in this method, since the timings at which data is written into adjacent bit lines are different, data on the bit lines which has been written first is influenced by noise caused by a variation in the potential amplitude of the adjacent bit line into which data is written later than above bit lines.

The problem is explained with reference to the drawing. FIG. 3 shows a dynamic semiconductor memory device of folded bit line configuration in which one sense amplifier is commonly used by four bit lines and every two of them are combined to make a bit line pair. In the drawing, BL indicates a bit line, WL indicates a word line, C indicates a memory cell, SA indicates a sense amplifier, and P1, P2 indicate control signal lines for connecting the bit lines BL to the sense amplifier SA alternatively.

FIG. 4 is an operation waveform diagram in the writing operation for memory cells C0n and C1n when a word line WL1 is selected. Before starting the writing operation, the bit line BL is precharged to a middle potential Vcc/2 between two writing potentials of "1" and "0" to be set into the memory cell C, that is, vcc and 0 V. The sense amplifier SA is activated twice according to data of the memory cells C0n and C1n, connection gates between the bit lines BL and the sense amplifier SA are selected in an order of at first P1 and then P2, and so data are written into the bit lines in an order of the memory cells C0n and C1n.

FIG. 5 is a waveform diagram in the writing operation for memory cells C2n and C3n when a word line WL2 is selected in the above dynamic semiconductor memory device. Like the case of FIG. 4, the connection gates between the bit lines BL and the sense amplifier SA are selected in an order of P1 and P2, and so data are written in an order of the memory cells C2n and C3n.

In the case of FIG. 5 in which the word line WL2 is selected, data is first written into the memory cell C2n and then data is written into the memory cell C3n connected to the bit line BL3n. The bit lines BL3n and BL1n make a bit line pair and are both arranged adjacent to the bit line BL2n which is connected to the memory cell C2n. After the data of the memory cell C2n is written on the bit line BL2n, BL2n is isolated from the sense amplifier and set in the electrically floating state. After that, the data of the memory cell C3n is written on the bit line BL3n, when the complementary data is written on the reference bit line BL1n. The potential of the bit lines BL1n and BL3n varies from the precharge potential Vcc/2 to 0 V and Vcc/2 to Vcc, and the signs thereof are different and the absolute values thereof are Vcc/2, which are equal to each other. Therefore, the amount of influences on BL2n by its adjacent bit lines' voltage swing via capacitive coupling between bit lines is Just canceled because the influence of BL3n to BL2n and the influence of BL1n to BL2n have same absolute value and opposite sign. The data of the memory cell C3n, which is written on the bit line BL3n has no noise because it is activated later than BL2n. Therefore, in this case, noises caused by the capacitive coupling between the bit lines can be cancelled in the writing operation for the memory cells C2n and C3n.

However, in the case of FIG. 4 in which the word line WL1 is selected, the writing operation for the memory cell C0n connected to the bit line BL0n is first effected while the gate control signal P1 is activated. Then the control signal P1 is de-activated to set the bit line BL0n into the electrically floating state. After that, the second control signal P2 is activated and the writing operation for the memory cell C1n which is connected to the bit line BL1n is effected. At this time, the voltage potential of the bit line BL1n varies from the precharge level Vcc/2 to the signal level Vcc or 0 V, while that of the reference bit line BL3n varies complementary to BL1n. In this case, differently from the case of FIG. 5, the formerly written bit line BL0n is not arranged between the later pair of bit lines, so the potential level of BL0n can be affected by the voltage swing of the BL1n and BL3 (n−1) through the capacitive coupling between bit lines. The magnitude of this influence on the BL0n's voltage deviation is 2×(Vcc/2)×CBB/CB since the absolute value of the voltage swing of an adjacent bit line is Vcc/2, the coupling ratio between the bit lines is CBB/CB and the influence comes from both sides of the bit line BL0n, from BL1n and from BL3(n−1), in the worst case.

Therefore, since written data is lost by 2CBB/CB in a relative value to a unit signal in the worst case, the amount of a signal at the time of reading is lowered by a corresponding amount. A lowering in the amount of signal at the time of reading of data causes the operation margin of the sense amplifier to be reduced. The writing noise is not present in a system in which one sense amplifier SA is. not commonly used by a plurality of bit lines and all of the bit line pairs are simultaneously activated.

The high integration density of the dynamic semiconductor memory device (DRAM) has been realized by miniaturization by the process technology and device technology, but in recent years, the miniaturization by the above technologies is coming to the upper limit. Therefore, recently, a NAND type DRAM having a NAND cell constructed by serially connecting a plurality of one-transistor/one-capacitor memory cells as a basic structure is proposed.

In the NAND type DRAM, when data is read out from a memory cell disposed at the farthest position from the bit line, the readout operation cannot be effected until data is read out from all of the cells lying closer to the bit line than the above cell, and therefore, the NAND type DRAM is inferior to the general DRAM in the access speed and the degree of freedom of access. However, since the number of contacts between the memory cells and the bit lines is reduced and consequently the area for one bit is significantly reduced, it has an extremely excellent feature in the high integration density per area and is suitable for memory devices of ultra high scale integration.

FIGS. 6 and 7 show the main portions of arrangement of a dummy cell and memory cell of the NAND type DRAM. In this example, four memory cells connected to word lines WL1 to WL4, WL5 to WL8, - - - are serially connected to construct a NAND cell. A memory cell is arranged at each intersection between the word line (WL) and the bit line (BL). The bit line BL1 on the memory cell side of FIG. 7 is connected to $\overline{BL1}$ on the dummy cell side of FIG. 6 to make a pair, and in the same manner, BL2 and $\overline{BL2}$, - - - make a pair so as to provide an open bit line configuration.

Each bit line is connected to a sense node (SNi) via a transfer gate (Qj). A pair of sense nodes (SNi, $\overline{SNi}$) are connected to a sense amplifier (SAi). To the sense node, an equalizing circuit (EQZi), I/O circuit (IOGi) and 8-bit register (RGk) are connected. Each bit line pair is connected sequentially to sense amplifier by activating the transfer gates one after another.

Since the NAND type DRAM is inferior to the general DRAM in the access speed and the degree of freedom of the access because of its structure, serious deterioration in the performance will not occur even if the sense amplifier is commonly used by a plurality of bit lines in a time-sharing fashion. But it is preferable to enhance the integration density by reducing the total number of sense amplifiers in above way.

The readout operation of the NAND type DRAM of FIGS. 6 and 7 is explained below with reference to the operation waveform of FIGS. 8A and 8B. In this example, it is assumed that memory cells connected to the word lines WL1 to WL4 are selected.

First, as shown in FIG. 8A, a signal EQ is set to a high voltage, the equalizing circuit EQZi is activated, and the potentials of the sense nodes SNi and $\overline{SNi}$ are equalized and set to a previously determined voltage (for example, intermediate voltage between the power supply voltages and the ground level). At this time, the bit line selection signals BSL1 to BSL4 are set at a high voltage, the transfer gates Q1 to Q16 are set in the conductive state and the potentials of the bit lines BL1 to BL8 and $\overline{BL1}$ to $\overline{BL8}$ are equalized and set to the same voltage level. After the voltage equalization is completed, the potentials of BSL1 to BSL4 are set to a low level and the transfer gates Q1 to Q16 are set to be nonconductive. Further, the potential of EQ is set to a low level and the equalizing circuit EQZi is also de-activated.

Next, the potential of the first word line WL1 is set to a high voltage level, data are read out from the memory cells MC connected to WL1 and supplied to corresponding bit lines BL1 to BL8. At this time, the potential of the dummy word line DWL1 is also set to a high voltage level and reference data is read out from the dummy cell DMC connected to the above dummy word line to corresponding bit lines/BL1 to/BL8.

Then the potential of the bit line selection signal BSL1 is set to a high voltage level while the potentials of WL1 and DWL1 are kept at the high voltage level, and consequently the transistors Q1 and Q9 are made conductive to connect the paired bit lines BL1, $\overline{BL1}$ to the paired sense nodes SN1, $\overline{SN1}$. After data is transferred from the bit line BL1 to the sense node SN1, the potential of BSL1 is set to a low voltage level and the transistors Q1 and Q9 are made nonconductive.

After this, the sense amplifier SA1 is activated, and data which is transferred from the memory cell to the sense node SN1 through the bit line BL1 is sensed and amplified. The amplified data is input to a first bit of register lying in one of the 8-bit registers RG1 and RG2 connected to the sense nodes SN1 and $\overline{SN1}$. At the same time, CSL1 which is an output signal of a column decoder (not shown) is set to a high voltage level and data is output to I/O line (I/O,/I/O).

After data is output to the register and I/O line, the sense amplifier SA1 is de-activated, the signal EQ is set to a high voltage level, and the equalizing circuit is operated again to equalize the potentials of the sense nodes SN1 and $\overline{SN1}$. At this time, since the transfer gates Q1 to Q16 are kept nonconductive, data read out from the cells and dummy cells are held on the bit lines BL1 to BL8 and $\overline{BL1}$ to $\overline{B, L8}$. When the voltage equalization is completed, the signal EQ returns to a low voltage level and the equalizing operation ends.

Next, the second bit line selection signal BSL2 is set to a high voltage level, the transistors Q2, Q10 are set into the conductive state, the bit line BL2 is connected to the sense node SN1 and data on the bit line BL2 is transferred to the sense node SN1. After this, the transistors Q2, Q10 are set into the nonconductive state. Then, like the former case, data from the bit line BL2 is sensed and amplified at sense nodes SN1 and $\overline{SN1}$, input to the second bit of the register, and output to the I/O line.

In succession, data of the bit lines BL3 and BL4 are sequentially read out, input to the third and fourth bits of the register, and output to the I/O line all the same way.

After data is read out from cells of four bits connected to the word line WL1 the potentials of all the bit lines and sense nodes are equalized. The potential of the word line WL2 is set to a high voltage level with the potential of the word line WL1 kept at the high voltage level as shown in FIG. 8B. Then, like the case of the word line WL1, data of cells of four bits connected to the word line WL2 are read out, input to the fifth to eighth bits of the register and output to the I/O line sequentially.

The same operation is repeatedly effected for the word lines WL3 and WL4, data of cells of 16 bits in total are read out, the readout data is held in the register and transferred to the I/O line. At this time, the same operation is simultaneously effected for the bit lines BL5 to BL8, and if SL2 is selected by the column decoder and set to a high voltage level, data is output to the I/O line, and if it is not selected, only the operation of holding data in the registers RG3 and RG4 is effected.

Next, the operation of re-writing data into the cell is effected. The re-writing operation is effected in a reverse order of the readout operation. At the time of completion of the readout operation, all of the potentials of the word lines WL1 to WL4 are set at the high voltage level. First, the bit line selection signal BSL4 is set to a high voltage level to transfer the sixteenth data from the register to a cell arranged at the intersection between the bit line BL4 and the word line WL4 through the sense node SN1.

After the writing operation of sixteenth data to its original memory cell from which it has been read out in the reading operation, the bit line selection signal BSL4 is set to a low voltage level, and instead, BSL3 is set to a high voltage level and the operation for rewriting the fifteenth data from the register into a memory cell arranged at the intersection between the bit line BL3 and the word line WL4 is effected. The same operation is repeatedly effected for fourteenth and thirteenth data, and when the re-writing operation for four cells connected to the word line WL4 is completed, the potential of the word line WL4 is set to a low voltage level to enclose data into each memory cell.

The operation similar to the above operation is repeatedly effected for wordlines WL3, WL2 and WL1, and when the operation of re-writing the first bit data into a cell disposed at the intersection between the bit line BL1 and the word line WL1 is finally effected, one operation cycle is completed. The operation of writing data from outside of the memory chip can be effected by inputting data via the I/O line, to the sense node SN1 and $\overline{SN1}$, for example, and then effecting the same procedure as that in the re-writing operation.

As described above, the NAND type DRAM is effective as a dynamic memory device of high integration density although the degree of freedom of access is limited to some extent.

However, the conventional NAND type DRAM shown in FIGS. 6 and 7 is inferior in the noise problem that it tends to be influenced by the interference noise between the bit lines as described below. The interference noise between the bit lines is explained by mainly using the memory cell MC4 with reference to FIG. 9.

First, at the time of reading, the potential of the word line WL1 is set at the high voltage level and changes in the memory cells MC1 to MC8 are transferred to corresponding bit lines. At this time, the bit line BL4 receives noises δR from both of the bit lines BL3 and BL5 via the coupling capacitance CBB between the bit lines. The magnitude ΔVN of the noise can be approximately expressed as follows where the amplitude of readout data from a memory cell is VSO and the total capacitance of the bit line is CB.

$$\Delta VN = VSO \cdot CBB/CB$$

Since the bit line BL4 is influenced by the bit lines BL3 and BL5 disposed on both sides thereof, independently it receives noises of 2ΔVN in total.

Furthermore, in the writing or re-writing cycle, data is written in an order of (MC4 and MC8)→(MC3 and MC7)→(MC2 and MC6)→(MC1 and MC5) as described before. When the operation of writing data into MC4 is completed, the transfer gate Q4 is made nonconductive. At this time, the potential of the word line WL1 is kept at the high voltage level in order to write data into MC3 or succeeding cells sequentially. After data of the memory cell MC4 is written, on the bit line BL4, BL4, to which MC4 is connected, is set in the electrically floating state.

Succeedingly, data is written into the memory cell MC3 through the bit line BL3, and a variation in the potential of the bit line BL3 in the writing operation is transmitted as noise δW to the bit line BL4 via the capacitive coupling between the bit lines. The magnitude of the noise at this time is approximately equal to ΔVN when it is expressed in terms of the magnitude of the noise which gives an influence on data at the time of reading.

When the writing operation is continuously effected and data is written into the cells MC1 and MC5, a variation in the potential of the bit line BL5 is also transmitted to the bit line BL4 as noise. After the operation of writing data into the cells MC1 and MC5 is completed, the potential of the word line WL1 is changed to a low voltage level. At this time, the potential of the cell MC4 is determined, but the potential equals to the potential of the bit line BL4 which is influenced by noise from the bit lines BL3 and BL5. Thus, also at the writing operation, it receives the noise of approx. 2·ΔVN.

As described above, the NAND type DRAM shown in FIGS. 6 and 7 receives the noise of approx. 2·ΔVN at the time of writing and the noise of approx. 2·ΔVN at the time of reading, and receives the noise of approx. 4·ΔVN= 4·VSO·CBB/CB in total in the worst case. In a DRAM of 16 Mbit or more, CBB/CB exceeds 0.1. That is, most portion of a signal which can be originally derived from a memory cell could be lost by the noise, thereby significantly reducing the operation margin.

Thus, the conventional dynamic semiconductor memory device tends to be influenced by the interference noise between the bit lines at the time of writing/reading, causing the operation margin to be reduced.

SUMMARY OF THE INVENTION

This invention aims to provide a dynamic semiconductor memory device in which the influence by the interference noise between the bit lines at the time of reading/writing is suppressed to maintain a good operation margin.

To solve the problem described above, a first semiconductor memory device of this invention is characterized in two respects. First, four neighbouring bit lines form a unit in which first and third bit lines form a bit line pair and second and fourth bit lines form a pair. So every two bit lines which form a bit lines pair have three adjacent bit lines, one of which is arranged between them and others of which are arranged each outside of the pair. Second, when one word line is selected, data of memory cell is transferred to at most one of two bit lines which are arranged outside of a pair of bit lines.

The following are examples of embodiments of the first semiconductor memory device according to the invention:

(1) A device where memory cells are so arranged that the data in them are transferred simultaneously to only one of two bit lines which are located adjacent and outside of a pair of bit lines, when one word line is selected.

(2) A device wherein the memory cells are NAND type DRAM cells which constitute memory cell units, each comprised of a plurality of memory cells connected in series.

(3) A device wherein at least one of the word lines is activated to transfer data to the bit lines, and the number of activated word lines differs in accordance with selected memory cells into which data is to be written or from which data is to be read.

(4) A device wherein less sense amplifiers are provided than pairs of bit lines.

(5) A device wherein a plurality of sense amplifiers is provided, each of them are commonly connected to a plurality of bit line pairs through the switching means which alternatively connect or disconnect the above sense amplifiers to the above plurality of bit lines pairs.

In the first semiconductor memory device of this invention, a signal on a bit line pair, which consists of the difference between paired bit lines, is influenced by only one of the bit lines located adjacent and outside the pair. The influence of the bit line which is arranged between the bit line pair is transmitted to the bit line and the reference bit line in the same amount, and thus it does not act as a noise source. Noise generated by a coupling capacitance between the bit lines of each pair amounts only CBB/CB to the unit signal, which is half the value 2CBB/CB generated in a conventional semiconductor memory device. Consequently the operation margin of the sense amplifier or other circuit is sufficiently improved according to this invention.

A second semiconductor memory device of this invention is characterized in that more pairs of bit lines are provided than sense amplifiers. Each sense amplifier is provided commonly for two or more pairs of bit lines. A sense amplifier sequentially reads/writes data items from/to the memory cells connected to bit lines which are activated by the above sense amplifier. The second semiconductor memory device is characterized by comprising a control circuit. The control circuit activates the bit lines in such an order that a bit line connected to any memory cell which is selected by a word line and into which data has been formerly written is located between a nearest pair of bit lines connected to another memory cell which are selected by the same word line and into which data is to be written later.

It is desirable that immediately before data is written into a cell connected to a bit line, the bit line be set at a precharge potential which is exactly intermediate between the alternative data-writing potentials "H" and "L" predetermined for the memory cells. This is because, if the potential "H" is selected for a memory cell, the potential of the bit line will increase from the intermediate value to the potential "H," and that of the complementary bit line will decrease from the intermediate value to the potential "L," at the time of writing data into the memory cell. These potential change of the bit line and that of the complementary line are identical in absolute value and opposite in polarity. Therefore, the interference which the pair of bit lines connected to memory cells into which data is to be written affects to the bit line connected to a memory cell into which data has already written via the capacitive coupling between bit lines is canceled and the amount of noise becomes zero by activating the bits lines in such an order that a bit line connected to any memory cell which is selected by a word line and into which data has been written is located between a nearest pair of bit lines connected to another memory cell which is selected by the same word line and into which data is to be written.

Nonetheless, the precharge potential for each bit line need not be exact center between the alternative data-writing potentials "H" and "L." As long as it falls between the potentials "H" and "L," the noise on the bit line connected to the memory cell into which data has already written can be reduced far more than in the conventional device, though it cannot be completely canceled out.

The second semiconductor memory device comprises fewer sense amplifiers than pairs of bit lines, each sense amplifier serving commonly for two or more pairs of bit lines. In spite of this, the noise generated by a coupling capacitance between the bit lines of each pair can be eliminated from the data to be written or can be reduced greatly. Consequently, the sense amplifiers can have a sufficient operating margin at the time of reading data from the memory cells.

The important point of a third semiconductor memory device of this invention is that a combination of bit lines constructing the bit line pairs connected to the sense amplifier is sequentially changed so as to cancel interference noises between the bit lines at the time of reading and writing operation from/to the memory cells connected to the bit line.

That is, the third semiconductor memory device of this invention is a dynamic semiconductor memory device which includes a plurality of memory cell units arranged on intersections between a plurality of word lines and a plurality of bit lines; a plurality of sense amplifiers for sensing and amplifying a potential difference between a corresponding pair of bit lines among the plurality of bit lines; first switching means for sequentially selecting bit lines which are contained in the plurality of bit lines and connected to the sense amplifier as a pair; and second switching means for changing a combination of a bit line pair constructed by the bit lines which are selected by the first switching means, and two adjacent bit lines which are disposed on both sides of the bit line connected to the memory cell unit are connected to the sense amplifier as a pair.

In this case, as an embodiment of the third semiconductor memory device of this invention, the following conditions can be given.

(1) A bit line electrically connected to the memory cell unit and paired bit lines disposed adjacent to and on both sides of the above bit line commonly and sequentially use the same sense amplifier.

(2) The memory cell unit is a NAND type DRAM cell constructed by serially connecting a plurality of memory cells.

(3) A plurality of word lines are divided into first word lines, second word lines and block word lines. The NAND type cells each constructed by serially connecting a plurality of memory cells are divided into a plurality of first NAND cells disposed on intersections between the first word lines and the (4k−3)th (k is a positive integer) bit line and 4k−th bit line and connected to the corresponding bit lines via switching elements whose conduction states are controlled by the block word lines, a plurality of second NAND cells disposed on intersections between the second word lines and the (4k−2)th bit line and (4k−1)th bit line and connected to the corresponding bit lines via switching elements whose conduction states are controlled by the block word lines, a plurality of third NAND cells disposed on intersections between the first word lines and the (4k−2)th bit line and (4k−1)th bit line and connected directly to the corresponding bit lines, and a plurality of fourth NAND cells disposed on intersections between the second word lines and the (4k–3)th bit line and 4k–th bit line and connected directly to the corresponding bit lines. When the i-th (i=1, 2, 3, 4) NAND cell is electrically connected to a corresponding one of the bit lines respectively by activating the corresponding word line or word lines, none of the j-th (i≠j, j=1, 2, 3, 4) cells which are disposed at the crosspoint of the activated word lines and a corresponding one of the bit lines is electrically connected to the bit lines respectively. When one or more of word lines are activated, the switching means connects a plurality of bit lines to a corresponding sense amplifier such that the bit line which is connected to one of the adjacent two i-th NAND cells and another bit line will make a bit line pair which puts the another i-th NAND cell immediately between the bit line pair.

(4) A plurality of bit line pairs constructed by a plurality of bit lines connected to the adjacent i-th (i=1, 2, 3, 4) NAND cells commonly use the same sense amplifier.

(5) The bit line sensing system is a folded bit line configuration.

According to the third semiconductor memory device of this invention, when the charge in a memory cell unit is transferred to the bit line which is electrically connected to the memory cell unit, the enforced deviation of the potential will appear on two bit lines adjacent to the above bit line via the coupling capacitance between the bit lines. However, since the adjacent two bit lines are connected to the sense amplifier in a paired form, no influence will be given to the sensing operation of the sense amplifier because the above deviations of the same amount appear on the respective bit lines. That is, the influence of the interference noise between the bit lines can be practically eliminated.

On the other hand, when data is written into the memory cell, noises will appear on bit lines adjacent both to the bit line into which data is written and to a bit line which makes a pair together with the writing bit line via the coupling capacitor between the bit lines. Since the bit line which is electrically connected to the memory cell unit is disposed between another pair of bit lines (the writing bit line and the bit line which makes a pair together with the writing bit line) connected to the sense amplifier, it is influenced by both of the writing bit line and the bit line which makes a pair together with the writing bit line when data is written into another memory cell by use of a bit line adjacent to the bit line which is electrically connected to the memory cell unit. However, the polarities of the noises from the writing bit line and the bit line which makes a pair together with the writing bit line are opposite to each other so that the noises to the bit line arranged between them will cancel each other. Therefore, there occurs substantially no influence of the interference noise between the bit lines.

In the above explanation, the bit line which is electrically connected to the memory cell unit indicates a bit line set in a state in which data is present in the cell before readout at the time of reading, data is present in the cell after writing at the time of writing, the cell is connected to the bit line directly or via the switching element, and the word line of the cell is activated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10A is a diagram showing an example of the arrangement of memory cell along to one word line of a dynamic semiconductor memory device according to a first embodiment of this invention;

FIG. 10B is a diagram showing a detail of memory cell M5;

FIG. 13 is a diagram showing an example of the arrangement of memory cells along one word line of a dynamic semiconductor memory device according to a fourth embodiment of this invention;

FIG. 14 is a diagram showing an example of the cell array constructed by a combination of the cells of the first to fourth embodiments, for illustrating a dynamic semiconductor memory device according to a fifth embodiment of this invention;

FIG. 18 is a first operation waveform diagram in the eighth embodiment;

FIG. 19 is a second operation waveform diagram in the eighth embodiment;

FIG. 23 is a diagram showing the main portion of a NAND type DRAM according to an eleventh embodiment of this invention;

FIG. 24 is a diagram showing the main portion of a NAND type DRAM according to an eleventh embodiment of this invention;

FIG. 25 is a diagram showing the cell structure of an improved NAND type DRAM which can be applied to the folded bit line configuration;

FIG. 26 is a timing diagram for illustrating the operation of the NAND type DRAM of FIG. 25;

DETAILED DESCRIPTION OF THE PREFERRED EMBODIMENTS

There will now be described an embodiment of this invention with reference to the accompanying drawings.

FIGS. 10A to 13 show first to fourth embodiments in which the connection of DRAM cells arranged along one word line WL in a dynamic semiconductor memory device is shown. FIG. 14 shows an example of the cell array obtained by a combination of the first to fourth embodiments.

In the above embodiments, eight bit lines BL (BL0n to BL7n) are connected to four sense amplifiers SA (more specifically, sense amplifiers, equalizing circuits, I/O and so on) and each bit line pair which is constructed of two bit lines has another one bit line extended between them respectively.

Figure 12:
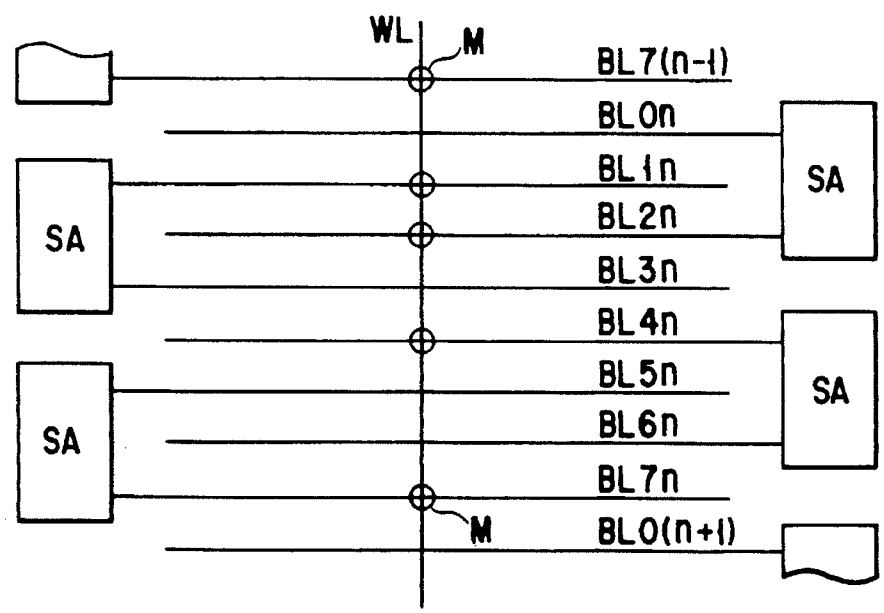
FIG. 12 is a diagram showing an example of the arrangement of memory cells along one word line of a dynamic semiconductor memory device according to a third embodiment of this invention.

Further, the bit line arrangement is made such that a memory cell M will be connected to only one of the two intersections between the same word line WL and two bit lines BL which are disposed adjacent to a bit line pair and are not disposed between the bit lines of the bit line pair. For example, as shown in FIGS. 10A and 12, two bit lines BL0n and BL4n are disposed adjacent to the bit line pair of BL1n and BL3n and are not disposed between the paired bit lines, and a memory cell M is connected to only one of the two intersections between the same word line and the two bit lines BL0n and BL4n, that is, the intersection between the word line and the bit line BL4n.

The cell array has a structure in which the eight bit lines BL are repeatedly arranged along the word line WL. The memory cell M is a DRAM cell of one-transistor/one-capacitor structure.

Figure 1:
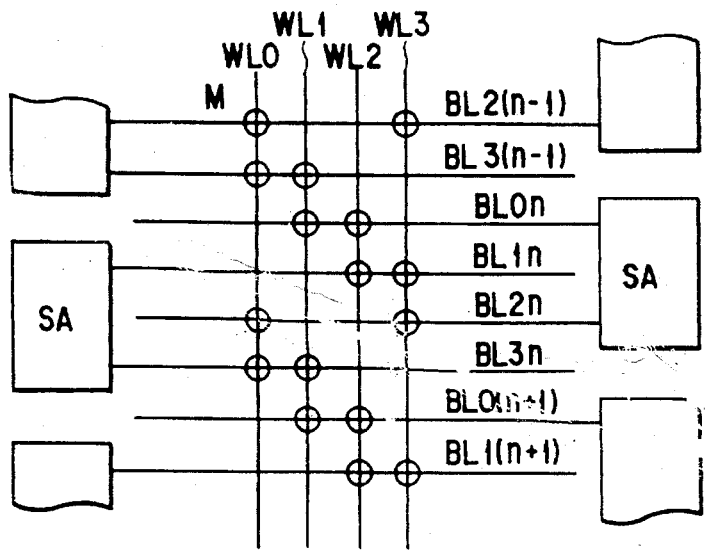
FIG. 1 is a diagram showing an example of the memory cell array of the conventional dynamic semiconductor memory device of folded bit line configuration.
Figure 2:
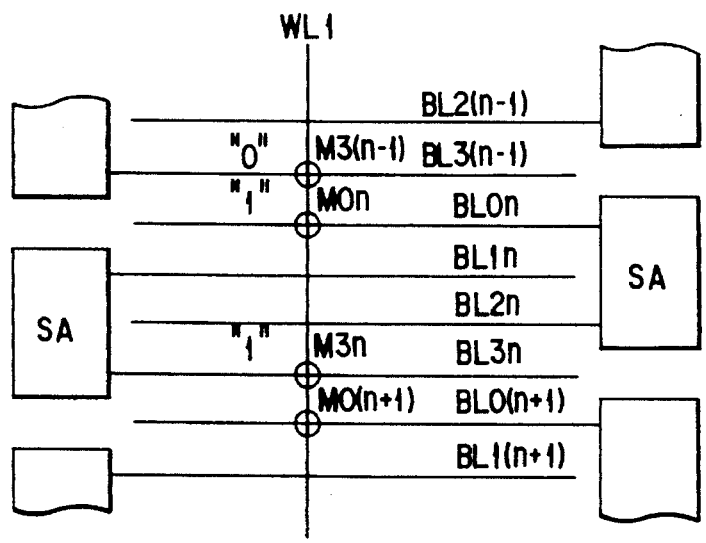
FIG. 2 is a diagram showing a case wherein much attention is paid to the word line WL1 in FIG. 1.
Figure 3:
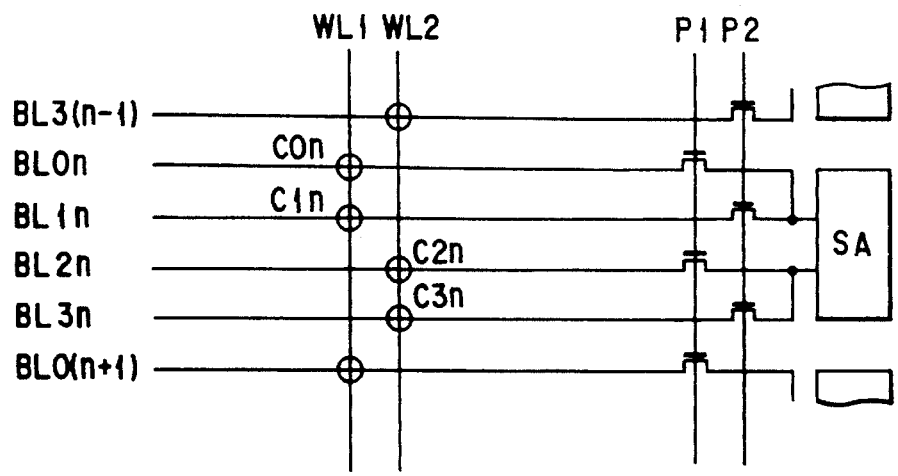
FIG. 3 is a diagram showing the circuit construction of the conventional dynamic semiconductor memory device of folded bit line configuration wherein one sense amplifier is shared by and sequentially accesses a number of bit liens.
Figure 4:
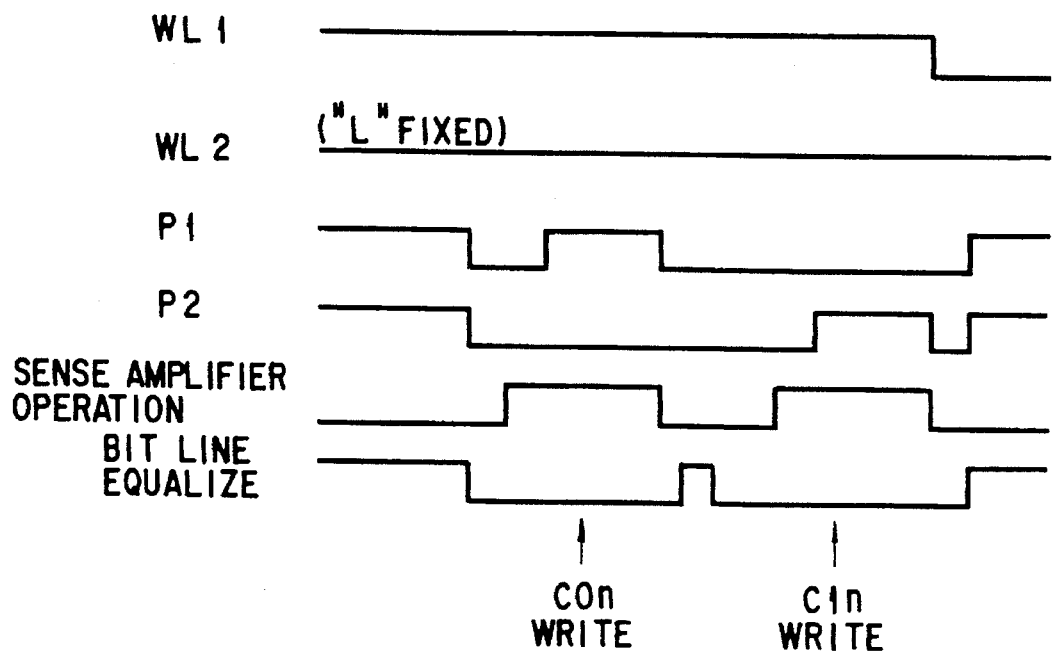
FIG. 4 is a first operation waveform diagram in the conventional device in FIG. 3.
Figure 5:
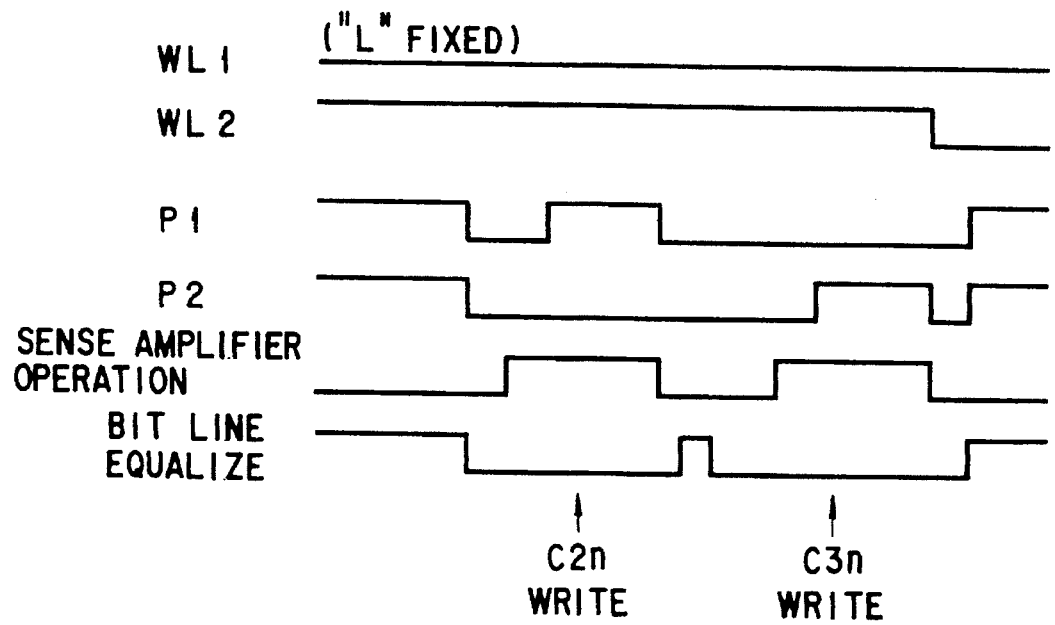
FIG. 5 is a second operation waveform diagram in the conventional device in FIG. 3.
Figure 6:
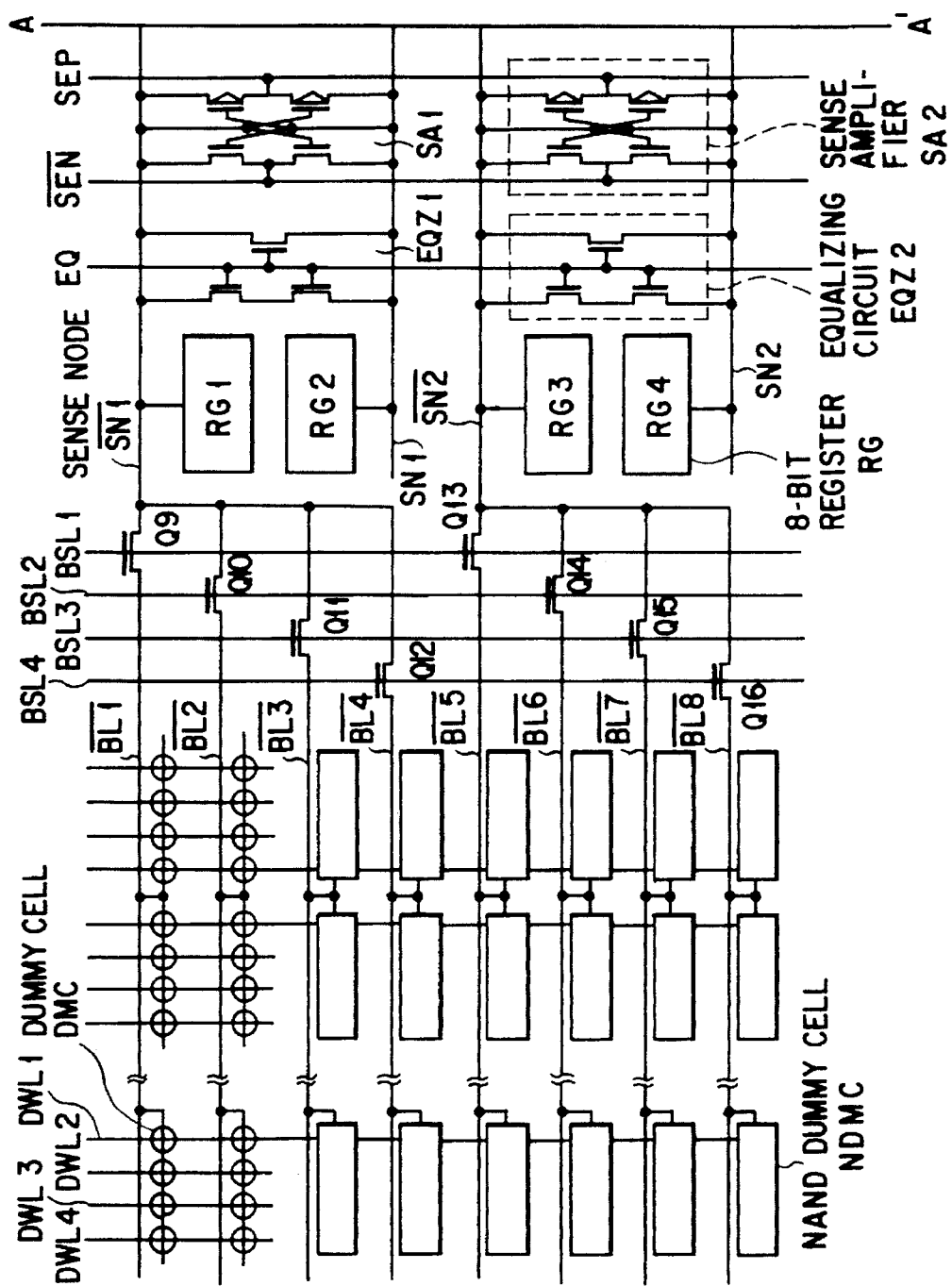
FIG. 6 is a diagram showing the main portion of the conventional NAND type DRAM.
Figure 7:
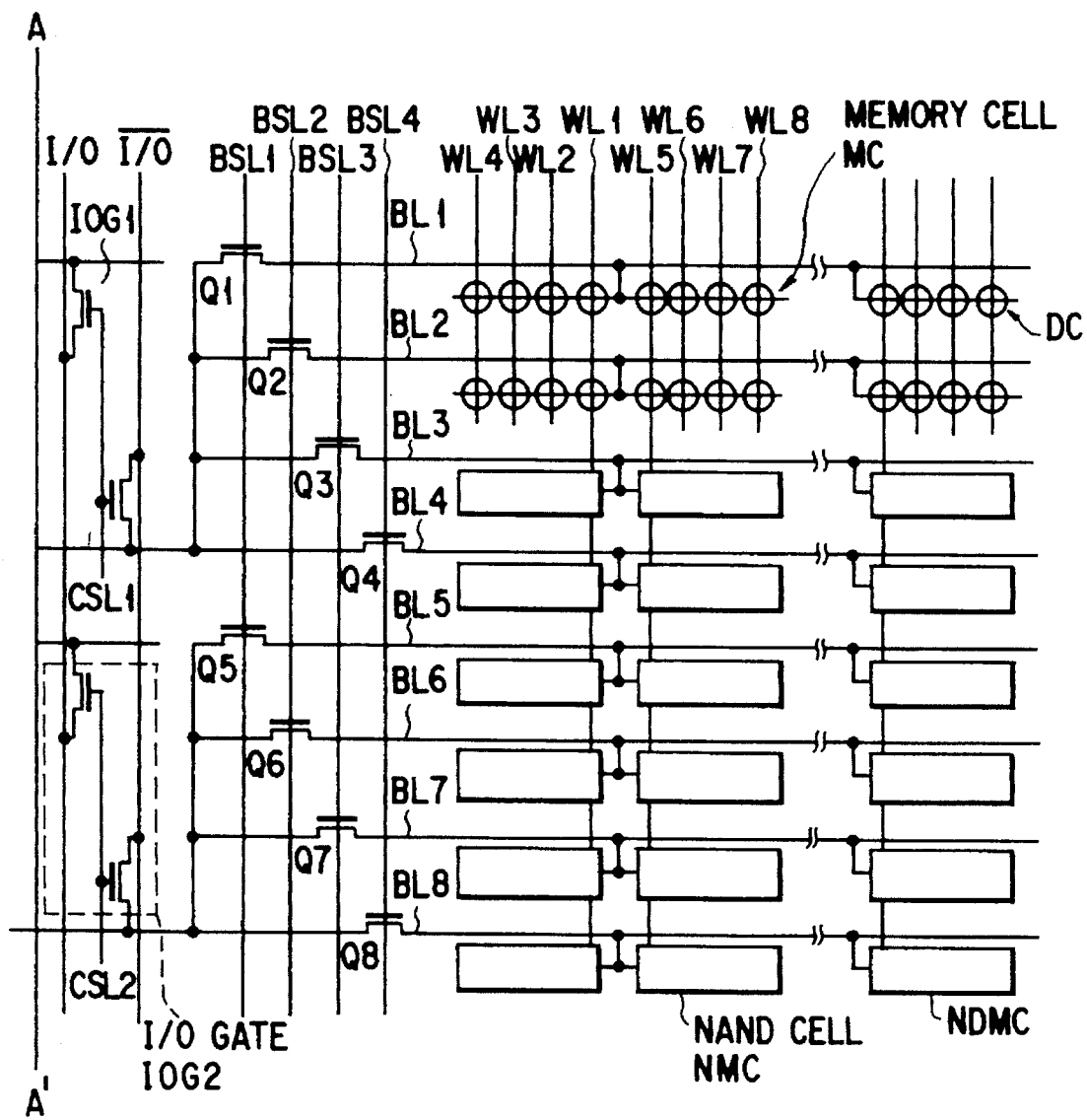
FIG. 7 is a diagram showing the main portion of the conventional NAND type DRAM.

Since the capacitive coupling noise by the potential variation of the bit line disposed between paired bit lines of one set is equally given to both of the bit line and the reference bit line, no degradation in the signal as a potential difference between them is caused between the paired bit lines. By this principle, the capacitive coupling noise between the paired bit lines caused when the word line WL3 in the conventional device of FIG. 1 is selected can be completely cancelled. However, when it is required to maintain the capacitive balance of the paired bit lines, it is impossible to always set the bit line which is connected to a memory cell from which data is read out between other paired bit lines.

Therefore, in this invention, the memory cells are arranged at only one of intersections of a word line and the two bit lines which are disposed adjacent to but are not disposed between the paired bit lines.

In this case, only one of the paired bit lines is influenced by the adjacent bit lines. The noise given to the bit line pair by the potential variation of a signal amount Vs of the one-side bit line is Vs×CBB/CB in the worst case. This is explained in the embodiment of FIG. 10A below.

When a word line WL is selected, data are transferred from the memory cells M connected to the bit lines BL2, BL3, BL4, BL5 to the respective bit lines. At this time, the potentials of the bit lines vary by +Vs or −Vs according to signals "1" or "0" written in the memory cells and the potential variation is transmitted to the adjacent bit lines by the capacitive coupling between the bit lines. In this case, the signal potential variation of the bit line BL2 is transmitted to the adjacent bit lines BL1 and BL3 in the same manner. However, since the bit lines BL1 and BL3 make a bit line pair, the potential variation by the capacitive coupling between the bit lines will not change the potential difference between the bit lines BL1 and BL3. Likewise, the potential variation of the bit line BL5 changes the potentials of the bit lines BL4 and BL6, but will not cause any noise.

On the other hand, the signal potential variation of the bit line BL3 changes the potentials of the adjacent bit lines BL2 and BL4. Therefore, one of the bit lines BL0 and BL2 making a bit line pair is subject to the potential variation. For example, when "0" is stored in the memory cell M2 and "1" is stored in the memory cell M3, the potential difference between the bit lines BL0 and BL2 is reduced by Vs×CBB/CB. That is, at the readout time of the memory cell M2, the noise becomes vs×CBB/CB in the worst case and the signal on the bit line pair is affected by only one half the noise in the prior art case.

Likewise, at the time of readout of the memory cells M3, M4 and M5, the noise of Vs×CBB/CB is received in the worst case, but this value is also only one half the noise occurring in the worst case in a case explained in the description of the related art and enough operation margin of a circuit such as a sense amplifier is ensured.

Figure 11:
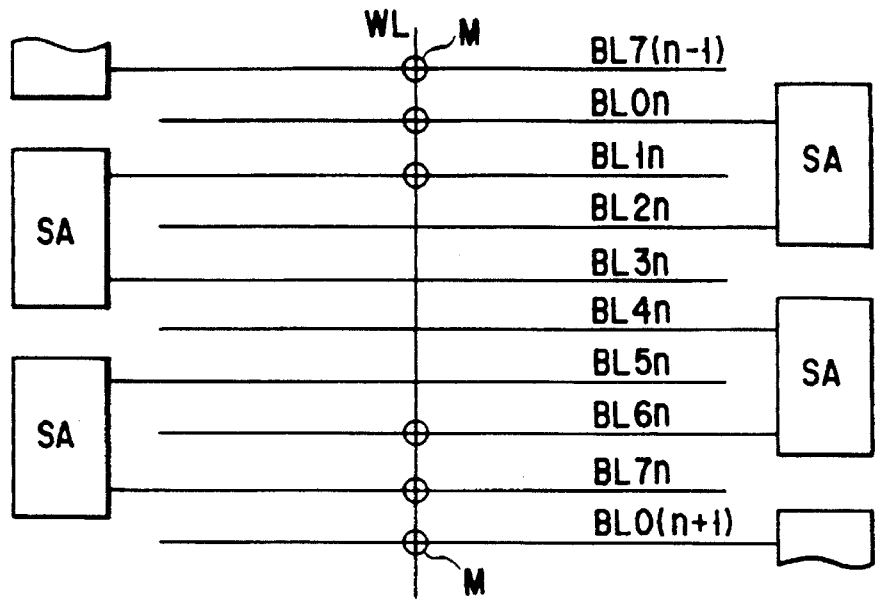
FIG. 11 is a diagram showing an example of the arrangement of memory cells along one word line of a dynamic semiconductor memory device according to a second embodiment of this invention.

The above explanation can be applied to the readout operation of all of the memory cells in the embodiments of FIGS. 11, 12 and 13, and the noise occurring in the worst case is Vs×CBB/CB and the amount of noise caused by the capacitive coupling between the bit lines can be reduced to one half that of the conventional case, making it possible to enlarge the operation margin of a circuit such as a sense amplifier SA.

Further, in the embodiment of FIG. 14, the cell arrangement is made uniform by combining the embodiments of FIGS. 10 to 13 and the number of memory cells connected to each bit line is set to the same value. In the cell array of this embodiment, structures in each of which two memory cells are successively arranged along the bit line are arranged in the word line direction with the adjacent structures deviated by one memory cell and it becomes easy to arrange the pattern of the memory cells.

Figure 15:
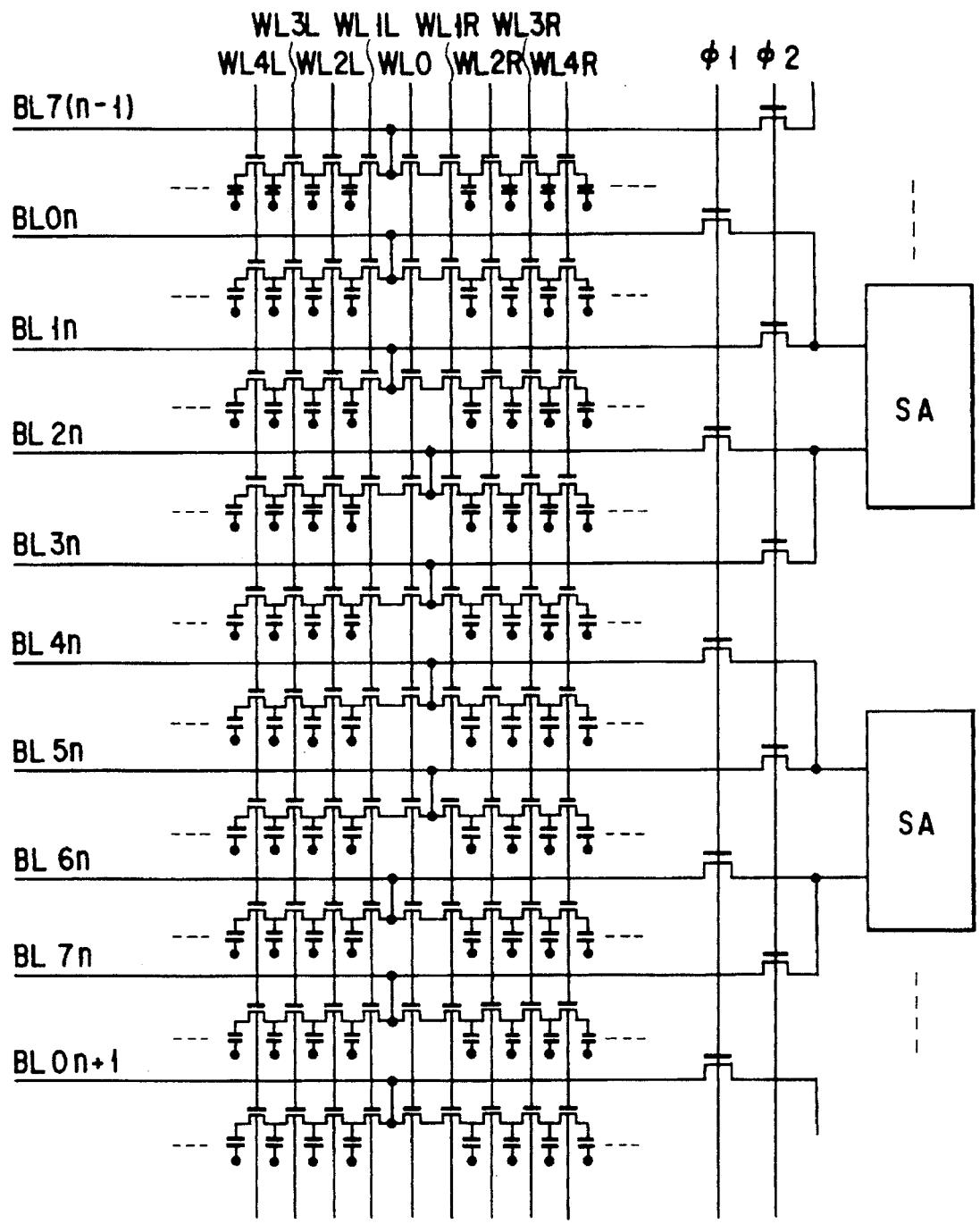
FIG. 15 is a diagram showing an example of the cell array of a dynamic semiconductor memory device according to a sixth embodiment of this invention.

FIG. 15 is a diagram showing an example of the cell array of a semiconductor memory device according to a sixth embodiment of this invention. In this embodiment, a NAND cell constructed by a serial connection of a plurality of DRAM cells is used as a basic unit. A bit line to which data is transferred is so selected by the combination of activation of word lines closest to the bit line contact that the folded bit line configuration is realized. Further, a plurality of bit line pairs commonly use the sense amplifiers SA and a method for sequentially effecting the readout or re-writing is used. That is, four bit lines BL (BL0n, BL1n, BL2n, BL3n) connected to one sense amplifier SA (more specifically, sense amplifier and equalizing circuit, I/O and so on) are connected to gates controlled by control signals $\phi 1$, $\phi 2$ such that the bit lines BL0n and BL2n will make a bit line pair and the bit lines BL1n and BL3n will make a bit line pair.

The important point of this invention is that a bit line to which data is transferred when a specified word line is selected is disposed between paired bit lines of one set, or the bit line to which data is transferred is at most one of the bit lines adjacent to one set of paired bit lines (except the bit line disposed between the paired bit lines). In this embodiment, the connection order of the transfer gates near the bit line contact is arranged so that the bit line to which data is transferred will be selected according to the above rule.

Also, in this case, the influence by the adjacent bit lines can be suppressed to one half the conventional case and the same effect as that of the first to fifth embodiments can be attained.

Figure 16:
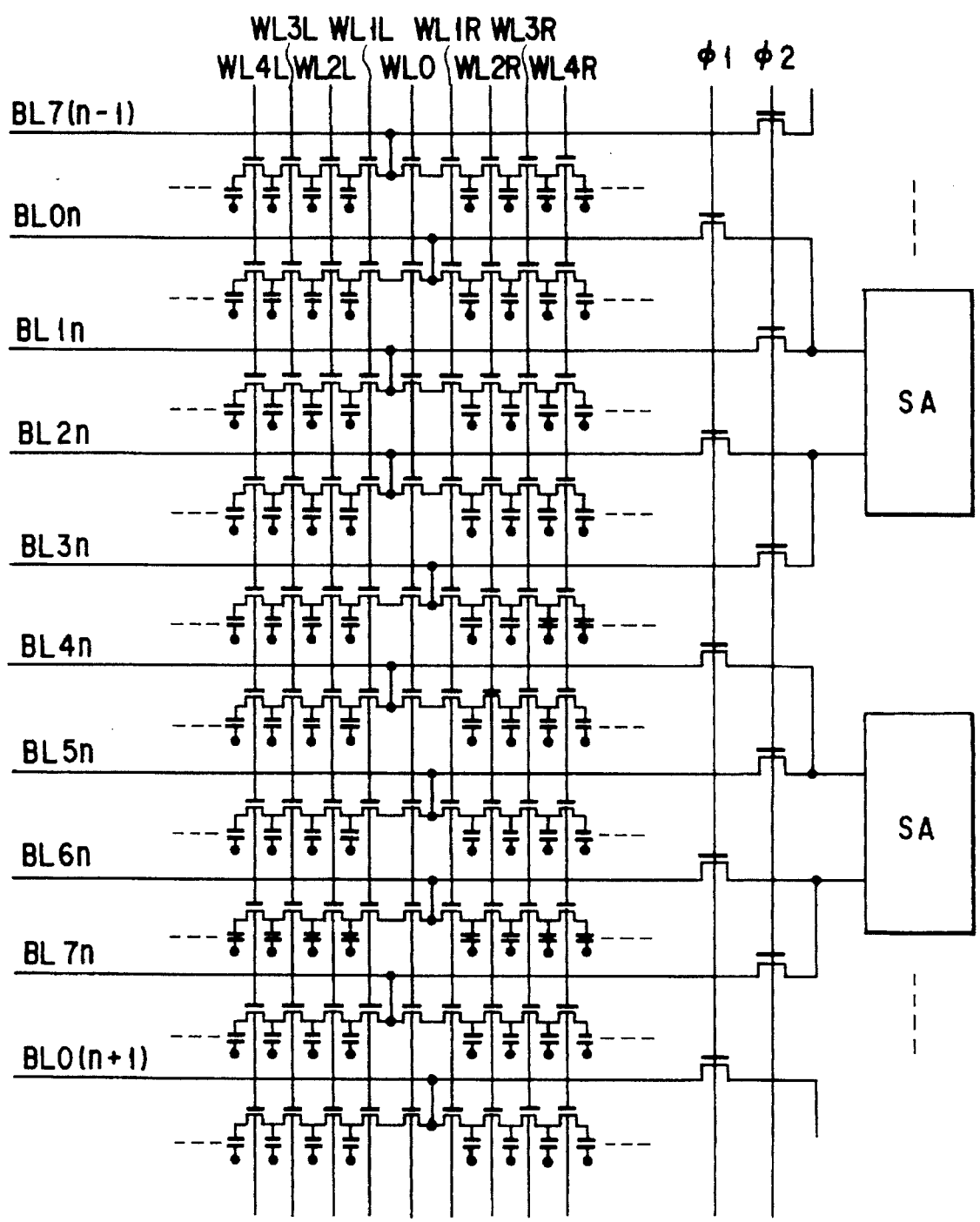
FIG. 16 is a diagram showing an example of the cell array of a dynamic semiconductor memory device according to a seventh embodiment of this invention.

FIG. 16 is a diagram showing an example of the cell array of a dynamic semiconductor memory device according to a seventh embodiment of this invention. Like the sixth embodiment, in this embodiment, a folded bit line configuration is realized even when the NAND cells each constructed by serially connecting a plurality of DRAM cells as a basic unit are used. This embodiment is different from the embodiment of FIG. 15 in the connection between the bit lines and the NAND cells, but basically, the connection order is based on the same rule as explained with reference to FIG. 15.

This invention is not limited to the first to seventh embodiments described above. In the above embodiments, a dynamic semiconductor memory device is taken as an example and explained, but if bit line pairs are made by bit lines set in every other position, a nonvolatile semiconductor memory device can be used. Further, this invention can be variously modified without departing from the technical scope thereof.

According to the embodiments described above, it is possible to provide a semiconductor memory device in which the noise caused by the capacitive coupling between the bit lines can be reduced to one half that of the conventional case and a sufficiently large operation margin of a circuit can be attained by adequately designing the arrangement of the memory cells in the structure in which bit line pairs are made by bit lines set in every other position.

Figure 17A:
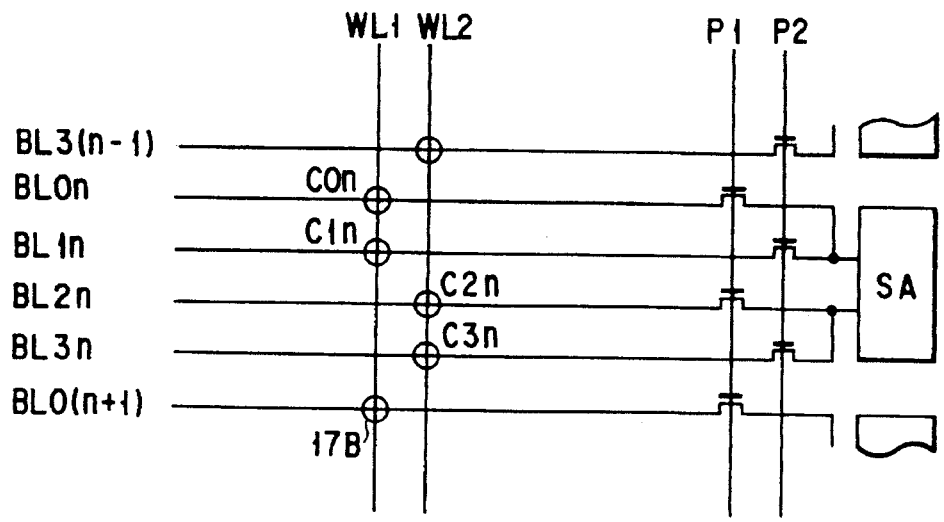
FIG. 17A is a diagram showing the circuit construction of a semiconductor memory device according to an eighth embodiment of this invention.

FIG. 17A is a diagram showing the circuit construction of a semiconductor memory device according to an eighth embodiment of this invention. In this embodiment, four bit lines BL (BL0n, BL1n, BL2n, BL3n) connected to one sense amplifier (more specifically, sense amplifier and equalizing circuit, I/O and so on) are connected to gates which are controlled by control signals P1, P2 such that the bit lines BL0n and BL2n will make a bit line pair and the bit lines BL1n and BL3n will make a bit line pair. In this example, the order of connection of the memory cells C to the bit line BL and word lines WL and the gates controlled by P1 and P2 is periodic for each sense amplifier, that is, for every four bit lines.

Figure 17B:
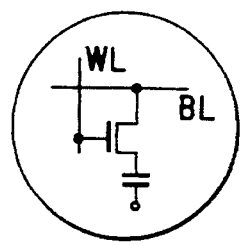
FIG. 17B is a diagram showing the detail of a memory cell in FIG. 17A.

The memory cell C is disposed on the intersection between the word line WL and the bit line BL which is one of the paired bit lines. The memory cell C is a one-transistor/one-capacitor type DRAM cell (FIG. 17B).

FIG. 18 is a first operation waveform diagram in this embodiment, for illustrating the writing operation of the memory cell when the word line WL1 of FIG. 17 is selected. FIG. 19 is a second operation waveform diagram in this embodiment, for illustrating the writing operation when the word line WL2 of FIG. 17 is selected. In this embodiment, data are sequentially written into the memory cells C0n and C1n respectively when the word line WL1 is selected, and data are sequentially written into the memory cells C2n and C3n respectively when the word line WL2 is selected. Further, in this embodiment, the order of activation of the control signals P1 and P2 for the gates for connecting the bit lines BL to the sense amplifier SA is changed according to the word line WL to be selected.

First, the operation waveform diagram of FIG. 18 is explained. Before writing data into the memory cell C, all of the bit lines BL are precharged to a middle potential between the writing potential of "1" and the writing potential of "0" in the memory cell C. The memory cell C1n is connected to the bit line BL1n which is disposed between the bit lines BL0n and BL2n making a bit line pair. Therefore, in order to write data into the memory cell C1n, the control signal P2 is first selected to activate the bit line pair BL1n and BL3n. After this, P2 is set into the non-selection state so as to set the bit lines BL1n and BL3n into the electrically floating state. Further, P1 is selected to activate the bit line pair BL0n and BL2n in order to write data into the memory cell C0n. After all of those, the potential of the word line WL1 is lowered to hold the data in the memory cell.

By the second activation of the sense amplifier, the potentials of the two bit lines BL0n and BL2n adjacent to the bit line BL1n in which data is first written are respectively changed from the precharged potential to the potentials of "1" and "0" of the writing potential in the memory cell, but since the capacitive coupling noises given to the bit line BL1n disposed between the paired bit lines are positive and negative and equal in the potential amplitude, the influence of potential changes of BL0n and BL2n on BL1n can be cancelled. Therefore, data of the memory cell C1n which is first written and data of the memory cell C0n which is written later is stored in the memory cells without giving the capacitive coupling noise to the data writing potential.

In the operation of FIG. 19, the word line WL2 is selected and data is written into the memory cells C2n and C3n. In this case, the bit line BL2n to be electrically connected to the memory cell C2n is disposed between the paired bit lines BL1n and BL3n. Therefore, data is first written into the memory cell C2n and data is later written into the memory cell C3n, and thus, the order of activation of P1 and P2 is different from that of a case of FIG. 18. Based on exactly the same principle, the writing potentials for the memory cells C2n and C3n will not be influenced by the capacitive coupling noise.

If the precharge potential of the bit line BL is set in just the middle level between the two writing potentials of "0" and "1" for the memory cell C, the capacitive coupling noise between the bit lines in the operation of writing into the memory cell C can be completely eliminated by the principle described above. Further, if the precharge potential of the bit line BL lies between the two writing potentials set into the memory cell C, the potential amplitudes of the bit lines BL driven later in paired manner and disposed on both sides of the bit line BL in which data is first written have opposite signs, and therefore, the capacitive coupling noises given by the potential amplitudes of adjacent paired bit lines to the bit line BL into which data is first written will cancel each other.

As a result, since the noise occurring in the worst case can be reduced in comparison with a conventional case wherein the potential amplitudes of the adjacent bit lines have the same sign, it is not necessary to set the precharge potential of the bit line BL to exactly the middle potential and the effect of noise reduction intended to attain in this invention can be attained even if the precharge potential is slightly deviated from the middle potential.

Figure 20:
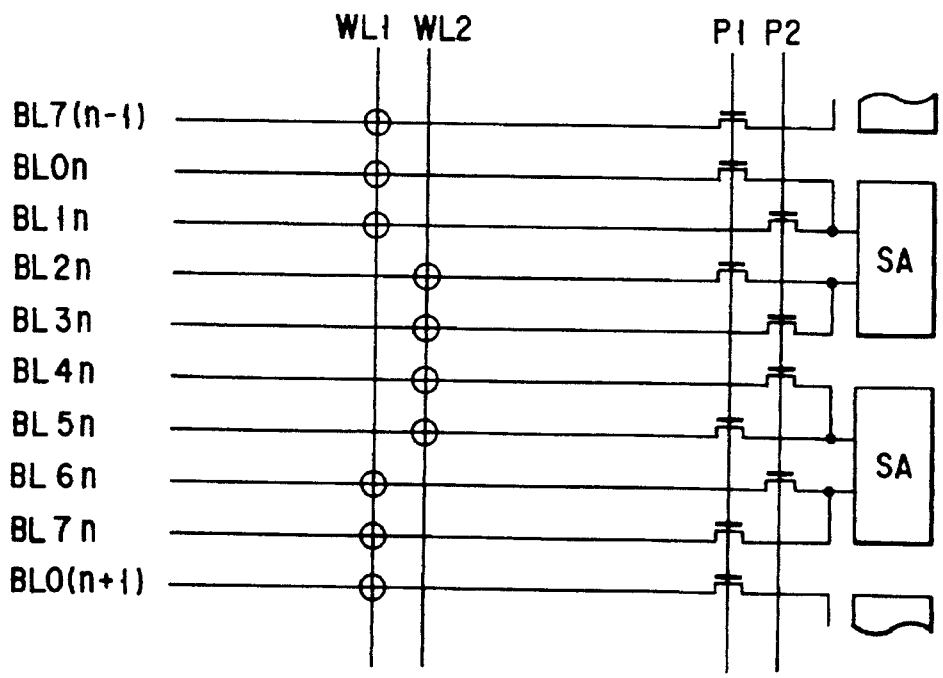
FIG. 20 is a diagram showing the circuit construction of a semiconductor memory device according to a ninth embodiment of this invention.

FIG. 20 is a diagram showing the circuit construction of a semiconductor memory device according to a ninth embodiment of this invention. The arrangement of the memory cells C and the arrangement of the bit lines BL and the connection gates of the sense amplifiers SA are made repeatedly for every eight bit lines, that is, every two sense amplifiers.

The operation principle and operation waveforms are exactly the same as those of the eighth embodiment, but in this embodiment, the capacitive coupling noise between the bit lines at the time of data reading can be reduced to one half that of the conventional case, because an arrangement of a bit line and a reference bit line is essentially similar as that of the first and second embodiments explained above.

Figure 21:
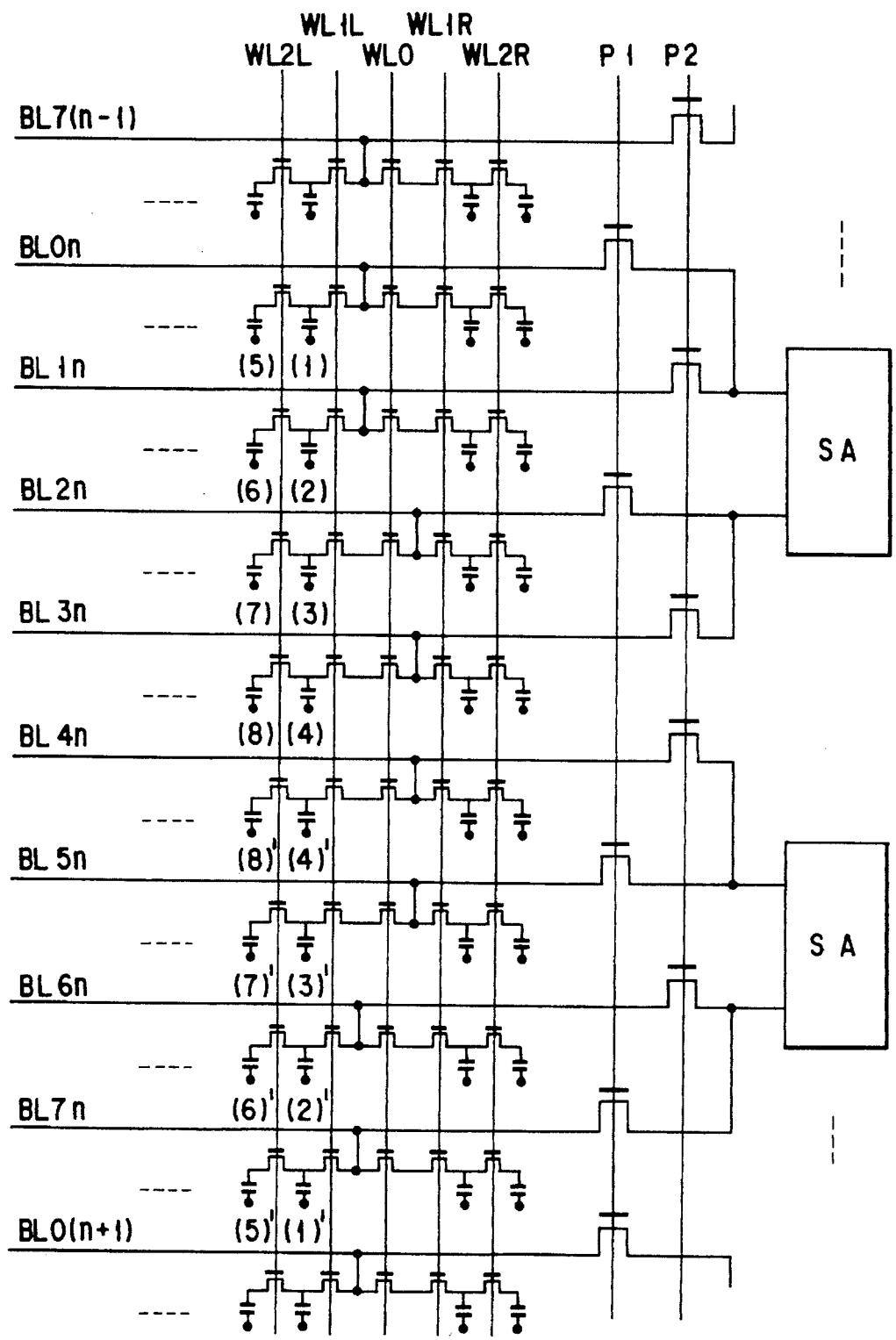
FIG. 21 is a diagram showing the circuit construction of a semiconductor memory device according to a tenth embodiment of this invention.

FIG. 21 is a diagram showing the circuit construction of a semiconductor memory device according to a tenth embodiment of this invention. In this embodiment, by using a NAND cell constructed by a series connection of a plurality of DRAM cells as a basic unit, a memory cell C which transfers data to a bit line is selected by a switch operated by the word lines closest to the bit line contact to realize the folded bit line configuration. This architecture has an advantage that both the high integration density by using a NAND cell and the high noise immunity of folded bit line scheme are realized. Further, one sense amplifier SA is commonly used by four bit lines BL and gates are controlled by control signals P1 and P2 such that every two of them make a bit line pair and are alternatively connected to the sense amplifier SA.

Figure 22:
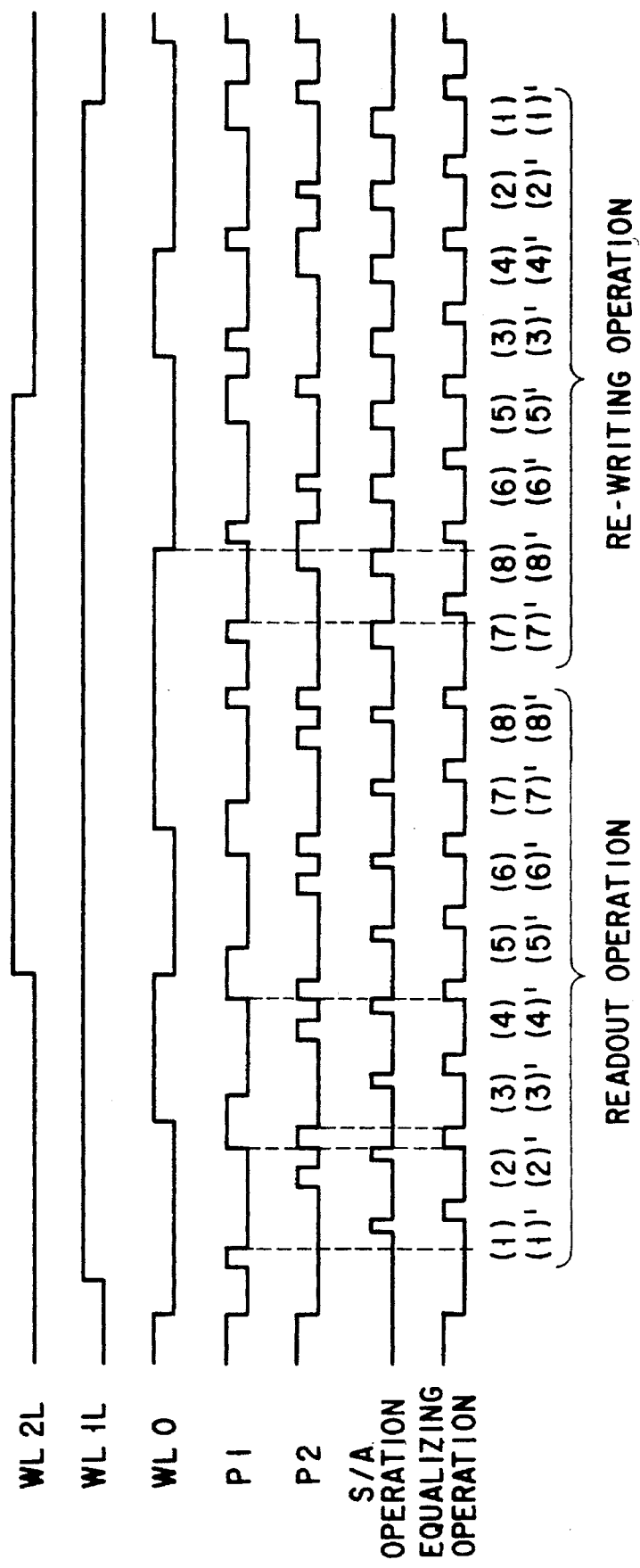
FIG. 22 is an operation waveform diagram in the tenth embodiment.

FIG. 22 shows an example of the operation waveform of this embodiment. In this embodiment, the order of readout is (1)(2)(3)(4)(5)(6)(7)(8) which are the numbers of the cells used in FIG. 21 (and (1)'(2)'(3)'(4)'(5)'(6)'(7)' (8)'), but the order of writing is not exactly the reversed order thereof and becomes (7)(8)(6)(5) (3)(4)(2)(1) (and (7)'(8)'(6)'(5)'(3)'(4)'(2)'(1)'). Also, in this case, like the eighth embodiment, the noise of writing data caused by the capacitive coupling between the bit lines can be reduced.

This invention is not limited to the eighth to tenth embodiments described above. In the above embodiments, a dynamic semiconductor memory device is taken as an example and explained, but if a plurality of bit line pairs commonly use a smaller number of sense amplifiers, a nonvolatile semiconductor memory device can be used. Further, this invention can be variously modified without departing from the technical scope thereof.

As described above in detail, according to the eighth to tenth embodiments, it is possible to provide a semiconductor memory device in which the noise of writing data caused by the capacitive coupling between the bit lines in a case where a plurality of bit line pairs commonly use a smaller number of sense amplifiers can be eliminated or significantly reduced and a sufficiently large operation margin of the sense amplifier at the time of reading can be attained by adequately determining the order of activation of the bit line pairs in the structure in which a plurality of bit line pairs commonly use a smaller number of sense amplifiers.

FIGS. 23 and 24 are diagrams showing the circuit constructions of the main portions of a NAND type DRAM according to an eleventh embodiment of this invention, FIG. 23 shows a portion including sense amplifiers, equalizing circuits, I/O circuits and registers, and FIG. 24 shows a cell array portion.

In this embodiment, in order to realize a DRAM which is highly resistant to noise, the cell array is formed of folded bit line configuration. In order to realize the folded bit line configuration without degrading the high integration density of the NAND cells, the array of the NAND cells is changed from that of the conventional case.

FIG. 25 shows the concrete arrangement of the NAND cells used in this embodiment. Like the conventional case, four memory cells (MC11 to MC14, MC15 to MC18, MC21 to MC24, MC25 to MC28) connected to word lines WL101 to WL104 or WL105 to WL108 are serially connected to constitute a NAND cell. In addition, in this embodiment, transfer transistors Q101, Q102 whose gates are connected to a block word line WL100 are each connected between a corresponding one of the NAND cells lying on one side and a corresponding bit line contact.

The transistors Q101, Q102 are inserted between one of the two NAND cells which share the bit-line and the bit-line contact. NAND cells to which transistors are connected without bit line contacts are located at opposite sides, for the bit lines BL101 and BL102 which form a pair.

In the cell array shown in FIG. 25, four NAND cells are arranged in a specific manner with respect to two bit lines. The first NAND cell and the third NAND cell are connected to the word lines WL101 to WL104 (collectively called "first word lines"), and the second NAND cell and the fourth NAND cell are connected to the word lines WL105 to WL108 (collectively called "second word lines"). The first NAND cell and the second NAND cell are connected to bit lines BL102 and BL101, respectively, via transfer transistors Q101 and Q102 which are used as switching elements. The third NAND cell and the fourth NAND cell are connected directly to the bit lines BL101 and BL102, respectively.

In the cell array of FIG. 25, MC11 to MC14 correspond to the third NAND cell, MC15 to MC18 correspond to the second NAND cell, MC21 to MC24 correspond to the first NAND cell, and MC25 to MC28 correspond to the fourth cell.

The basic operation of this embodiment will now be explained, with reference to FIG. 26 which is a waveform diagram illustrating a part of operation of the cell array shown in FIG. 25.

A case wherein the word lines WL101 to WL104 are selected is explained as an example. First, the potential of WL101 is set to a high voltage level. At this time, the potential of the block word line WL100 is kept at the low voltage level. Therefore, data of the memory cell MC11 appears on the bit line BL101. However, data of the memory cell MC21 is not output to the bit line BL102 since the transistor Q102 is set in the nonconductive state. As a result, the bit line BL102 can be used as a reference bit line (B L) of the bit line BL101. Data of the memory cell MC11 is read out by the sense amplifier by using the bit lines BL101 and BL102 as a bit line pair in the folded bit line manner and then the bit line pair is reset to the middle potential.

Next, the potential of the block word line WL100 is set to the high voltage level while the potential of the word line WL101 is kept at the high voltage level, and data of the memory cell MC21 is read out to the bit line BL102. At this time, since data of the memory cell MC11 is already read out and no data is present in the memory cell, the bit line BL101 can be used as a reference bit line of the bit line BL102. After data of the memory cell MC21 is read out and all the bit lines are precharged to the middle potential, the potential of the block word line WL100 is lowered to a low voltage level.

Then, the potential of the word line WL102 is set to a high voltage level and data of the memory cell MC12 is read out through the stage node of the memory cell MC11. The same operation is repeatedly effected to read out data of the memory cells up to the memory cell MC24.

With the above construction, the folded bit line configuration can be realized while the high integration density of the NAND cells is kept.

Referring back to FIGS. 23 and 24, the eleventh embodiment will be further described. First, the connection of the NAND cells, the bit lines, the word lines and the switching elements will be explained with reference to FIG. 24. A plurality of bit lines are provided. Hereinafter, the uppermost bit line BL11, the second uppermost bit line BL12 will be referred to as "the first bit line" and "the second bit line," and the bit line located at the m-th position from the uppermost will be referred to as "the m-th bit line."

Word lines WL10 to WL18 are shown in FIG. 24. The word lines WL11 to WL14 correspond to the first word lines described above; the word lines WL15 to WL18 correspond to the second word lines; and the word line WL10 corresponds to the block word line and is used to drive the switching elements. A plurality of NAND cells are connected to the word lines and the bit lines BL11, BL12, . . .

The first NAND cell is arranged on each of the intersections between the first word lines and the (4k−3)th (k is a positive integer) and 4k-th bit lines, the second NAND cell is arranged on each of the intersections between the second word lines and the (4k−2)th and (4k−1)th bit lines, the third NAND cell is arranged on each of the intersections between the first word lines and the (4k−2)th and (4k−1)th bit lines, and the fourth NAND cell is arranged on each of the intersections between the second word lines and the (4k−3)th and 4k-th bit lines.

The bit lines BL11 to BL24 to which the NAND cells are connected are connected to corresponding common bit lines CBL11 to CBL17 via transistors Q21 to Q34 whose conduction states are controlled by first bit line selection signals BSL11, BSL12. The common bit lines CBL11 to CBL17 are connected to corresponding sense nodes $\overline{SN11}$, SN11, - - -, SN13 via respective transistors Q41 to Q52 whose conduction states are controlled by second bit line selection signals DSL11, DSL12.

Like the conventional case, a pair of sense nodes are connected to the sense amplifiers (SA11, SA12, SA13), equalizing circuits (EQZ11, EQZ12, EQZ13), I/O circuits (IGO11, IOG12, IOG13), and 8-bit registers (RG11, RG12, RG13, RG14, RG15, RG16).

The first bit line selection signals BSL11, BSL12 are signals for controlling and connecting the bit line pair commonly using the sense node to the sense node on the time sharing basis. The second bit line selection signals DSL11, DSL12 are signals for controlling and selectively connecting the sense nodes to the sense amplifier to cancel the interference noise between the bit lines according to the memory cell to be accessed.

In this embodiment, when the potentials of any of the word lines WL11 to WL14 are set at the high voltage level, DSL11 among the second bit line selection signals is set to a high voltage level if the potential of the block word line WL10 is set at the low voltage level, and DSL12 is set to a high voltage level if the potential of WL10 is set at the high voltage level. When the potentials of any of the word lines WL15 to WL18 are set at the high voltage level, DSL12 is set to a high voltage level if the potential of WL10 is set at the low voltage level, and DSL11 is set to a high voltage level if the potential of WL10 is set at the high voltage level.

Now, the operation of the NAND type DRAM of FIGS. 23 and 24 is explained with reference to the operation waveforms of FIG. 27. In this case, assume that memory cells connected to the word lines WL11 to WL14 are selected. The explanation is made with much attention paid to the bit lines BL11 to BL16.

Figure 27:
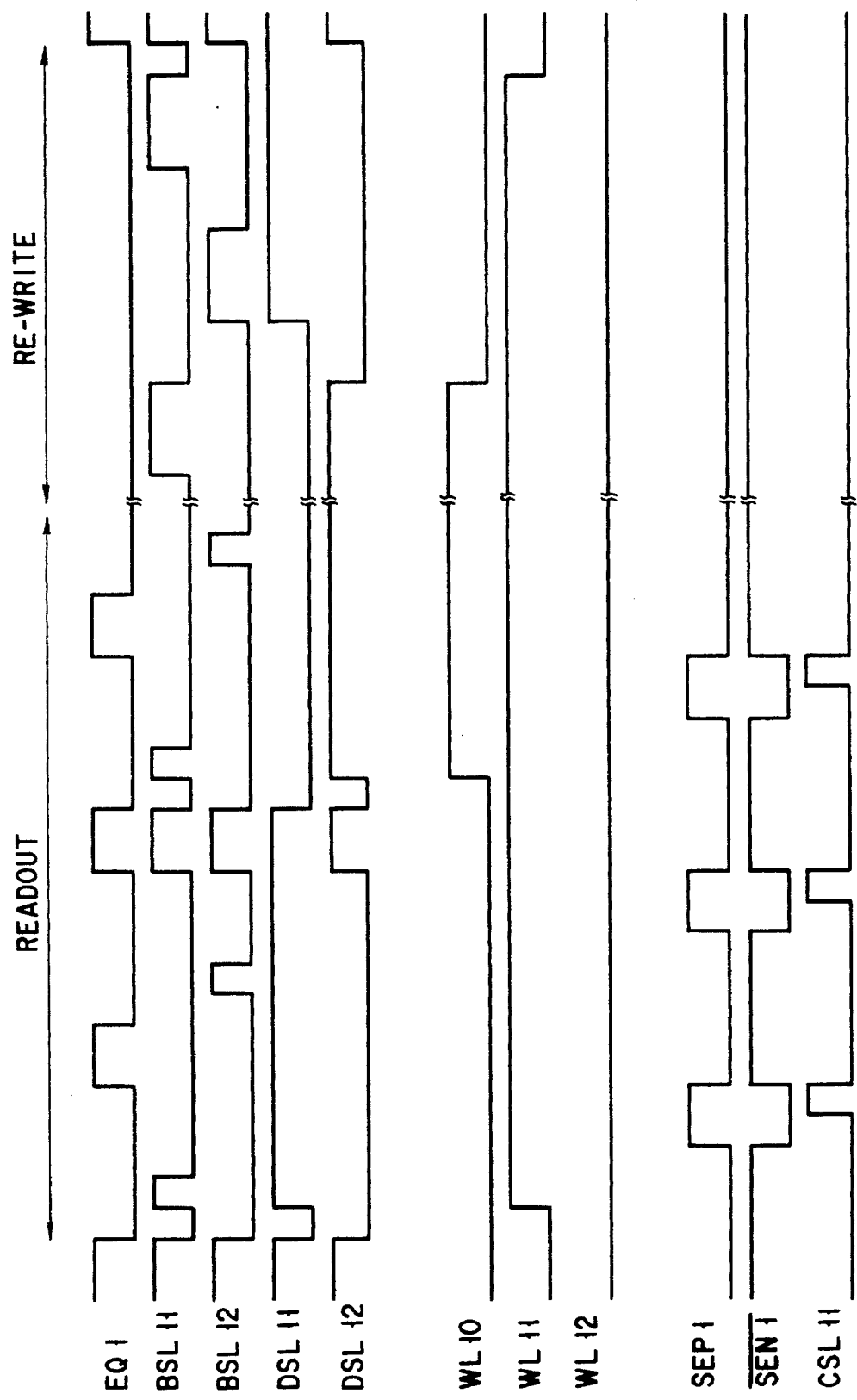
FIG. 27 is a timing diagram for illustrating the operation of the eleventh embodiment.

In the stand-by state, as shown in FIG. 27, a signal EQ1 is set to a high voltage level, the equalizing circuit is operated, and the potentials of the sense nodes SN11 and $\overline{SN11}$ are equalized and set to a preset voltage level. At this time, the bit line selection signals BSL11, BSL12, DSL11, DSL12 are set at the high voltage level, the transfer transistors Q21 to Q26, Q41 to Q45 are set in the conductive state, and the potentials of the bit lines BL11 to BL16, common bit lines CBL11 to CBL13 are also equalized. After the voltage equalization, BSL11, BSL12, DSL11, DSL12 are set to the low voltage level, the transfer transistors Q21 to Q26, Q41 to Q45 are set into the nonconductive state, EQ1 is set to the low voltage level, and the equalizing circuit is de-activated.

Next, the potential of the word line WL11 is set to the high voltage level. At this time, the potential of the block word line WL10 is kept at the low voltage level. Therefore, data are read out from memory cells which are connected to the word line WL11 and which are directly connected to the corresponding bit lines without passing the transfer transistors whose gates are connected to the block word line WL10 and supplied to the corresponding bit lines which are, in this example, the bit lines BL12, BL13 and BL16.

Figure 28A:
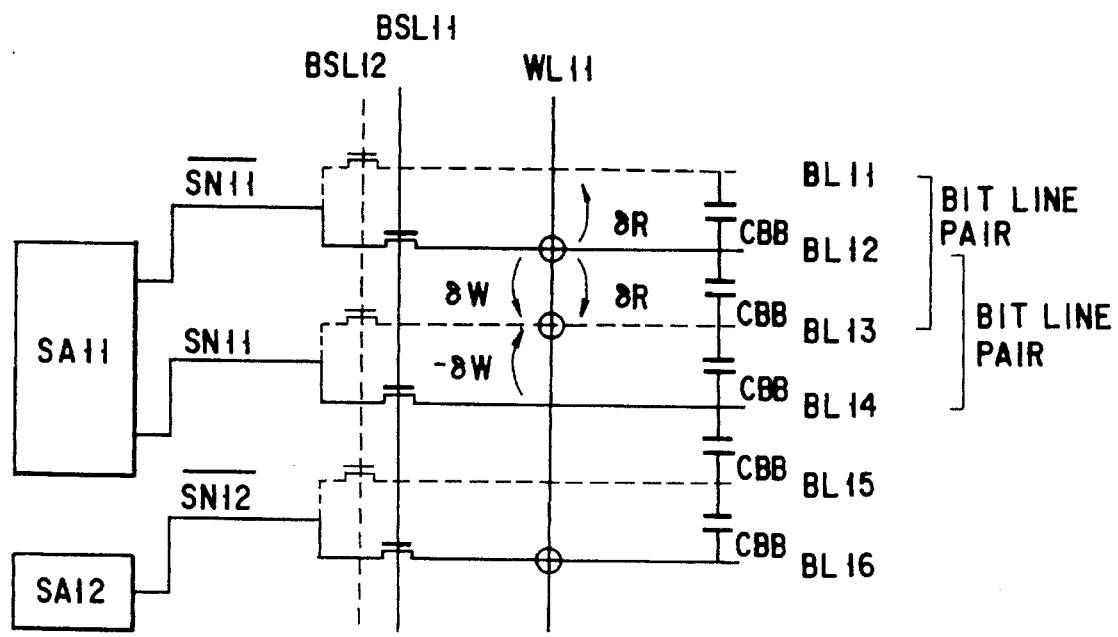
FIG. 28A is a diagram for illustrating the reduction effect of the interference noise between the bit lines in the eleventh embodiment.

The bit line selection signal BSL11 is set to the high voltage level with the potential of WL11 kept at the high voltage level. Further, DSL11 among the second bit line selection signals is set to the high voltage level. The transistors Q22, Q24, Q26 and transistors Q41, Q43, Q45 are made conductive, the bit lines BL12, BL14, BL16 are connected to the common bit lines CBL11, CBL12, CBL13, and the common bit lines CBL11, CBL12, CBL13 are connected to the sense nodes $\overline{SN11}$, SN11, $\overline{SN12}$. The bit line BL14 acts as a reference bit line of the sense amplifier SA11. Connection between the bit line and the sense node at this time is schematically shown in FIG. 28A.

After data is transferred from the bit line BL12 to the sense node $\overline{SN11}$, BSL11 is set to the low voltage level and the transfer transistors Q22, Q24, Q26 are made nonconductive. After this, the sense amplifier is activated and data is sensed and amplified. The amplified data is input to the first-bit register of one of the 8-bit registers RG11 and RG12 connected to the sense nodes/SN11 and SN11 respectively. At the same time, CSL11 which is an output signal of a column decoder (not shown) is set to the high voltage level and data is output to the I/O line (I/O1,/I/O1).

when data is output to the register and I/O line, the sense amplifier is de-activated, the signal EQ1 is set to the high voltage level, the equalizing circuit is operated again, and the potentials of the sense nodes SN11 and $\overline{SN11}$ are equalized. At this time, since the transfer transistors Q21 to Q26 are kept nonconductive, data items read out from the cells are maintained as they are on the bit lines BL11 to BL16. After completion of the voltage equalization, the signal EQ1 is returned to the low voltage level.

Next, the bit line selection signal BSL12 is set to the high voltage level, the transistors Q21, Q23, Q25 are made conductive, the bit lines BL11, BL13, BL15 are connected to the common bit lines CBL11, CBL12, CBL13, and after data of the bit line BL13 is supplied to the sense node SN11, the transistors Q21, Q23, Q25 are made nonconductive. BL11 acts as a reference bit line of the sense amplifier SA11. After this, like the former case, data of the bit line BL13 is sensed and amplified, input to the second bit of the register and output to the I/O line.

After this, the bit line selection signals BSL11, BSL12, DSL11, DSL12 and signal EQ1 are set to the high voltage level with the potential of the word line WL11 kept at the high voltage level, and the potentials of the bit line BL11 to BL16, common bit lines CBL11, CBL12, CBL13, and sense nodes SN11, $\overline{SN11}$, $\overline{SN12}$ are equalized. After completion of the voltage equalization, the signals BSL11, BSL12, DSL11, DSL12 and EQ1 are set to the low voltage level.

Figure 28B:
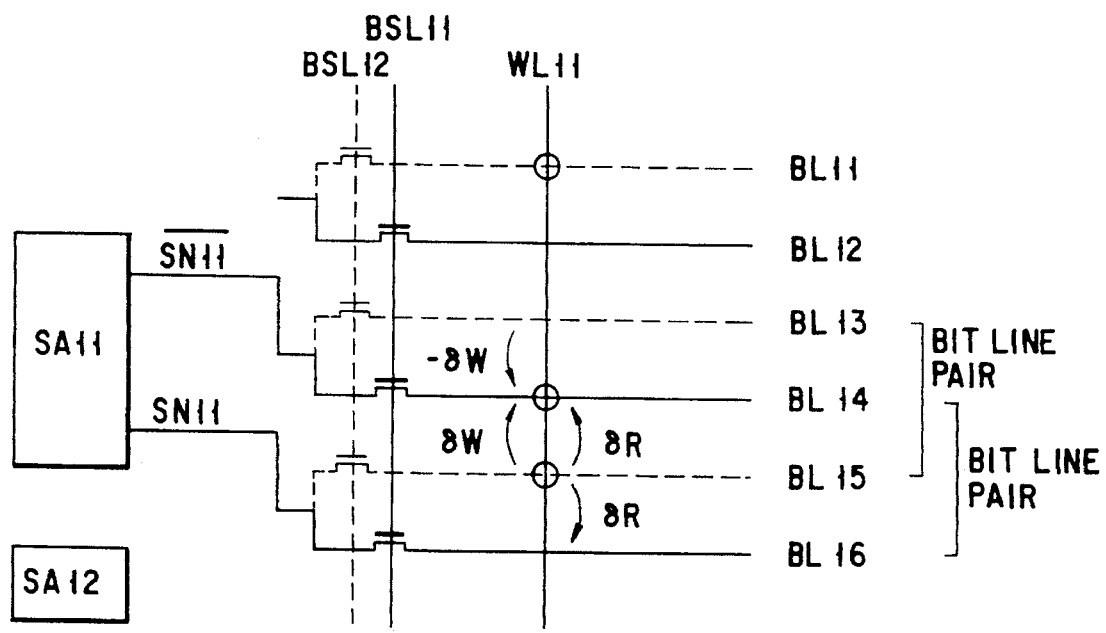
FIG. 28B is a diagram for illustrating the reduction effect of the interference noise between the bit lines in the eleventh embodiment.

Next, the potential of the block word line WL10 is set to the high voltage level and data of corresponding memory cells are read out to the bit lines BL11, BL14, BL15. Since data of the cells corresponding to the bit lines BL12, BL13, BL16 are already read out, cell data will not appear on them. Further, if the bit line selection signal BSL11 is set to the high voltage level, the transistors Q22, Q24, Q26 are made conductive, and the bit lines BL12, BL14, BL16 are respectively connected to the common bit lines CBL11, CBL12, CBL13. Also, DSL12 among the second bit line selection signals is set to the high voltage level at this time, and the common bit lines CBL12, CBL13 are respectively connected to the sense nodes $\overline{SN1}$, $\overline{I}$, SN11. Connection between the bit lines and sense nodes attained at this time is schematically shown in FIG. 28B.

After data of the bit line BL14 is transferred to the sense node $\overline{SN11}$, the transistors Q22, Q24, Q26 are made nonconductive. After this, like the former case, data of the bit line BL14 sensed and amplified by using the bit line BL16 as a reference bit line, input to the third bit of the register, and output to the I/O line.

Further, the sense amplifier is de-activated, the signal EQ1 is set to the high voltage level, the equalizing circuit is operated again, and the potentials of the sense nodes SN11, $\overline{SN11}$ are equalized. At this time, since the transfer transistors Q21 to Q26 are kept in the nonconductive state, data items read out from the cells are maintained on the bit lines BL11 to BL16. After completion of the voltage equalization, the signal EQ1 is returned to the low voltage level.

Next, the bit line selection signal BSL12 is set to the high voltage level, the transistors Q21, Q23, Q25 are made conductive, the bit lines BL11, BL13, BL15 are connected to the common bit lines CBL11, CBL12, CBL13, and after data of the bit line BL15 is supplied to the sense node SN11, the transistors Q21, Q23, Q25 are made nonconductive. BL13 acts as a reference bit line of the sense amplifier SA11. After this, like the former case, data of the bit line BL15 is sensed and amplified, input to the fourth bit of the register and output to the I/O line.

Figure 8A:
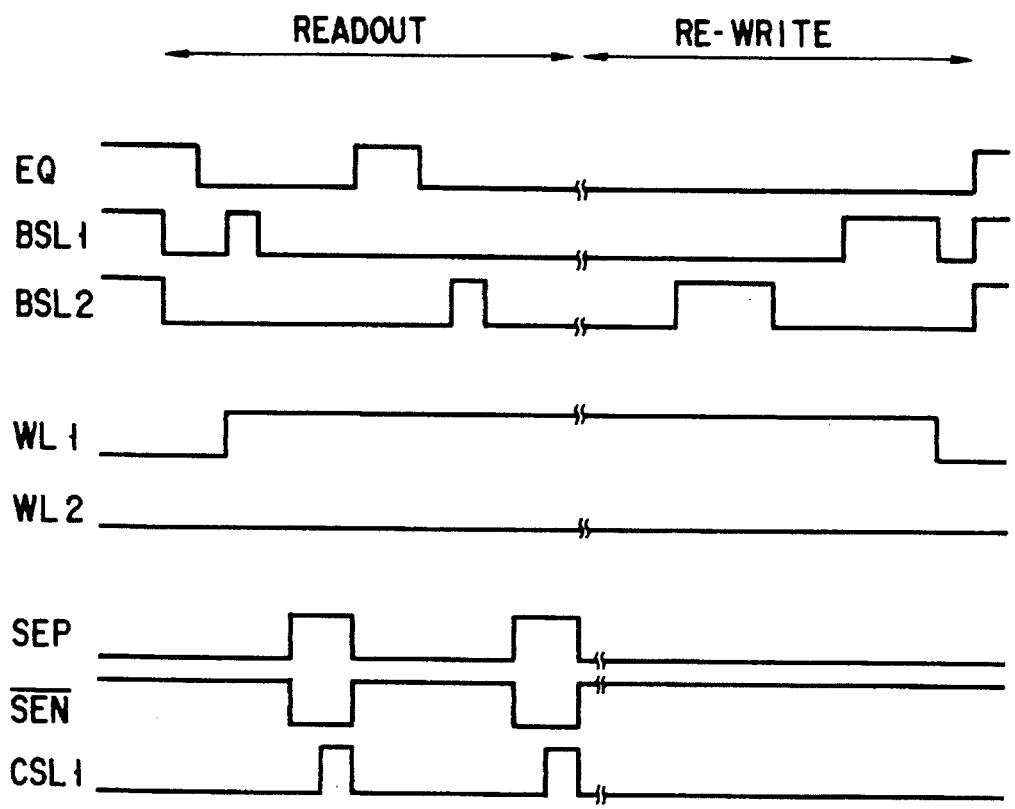
FIG. 8A is a part of timing diagram for illustrating the operation of the conventional NAND type DRAM.
Figure 8B:
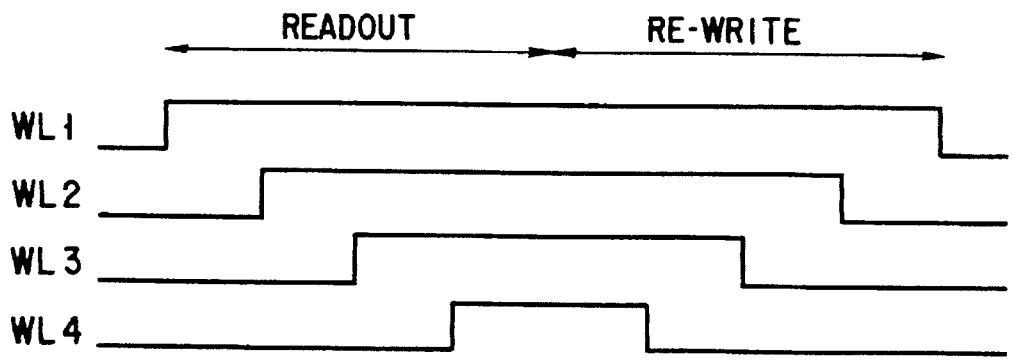
FIG. 8B is a timing diagram for illustrating the operation of the word lines in the conventional NAND type DRAM.
Figure 9:
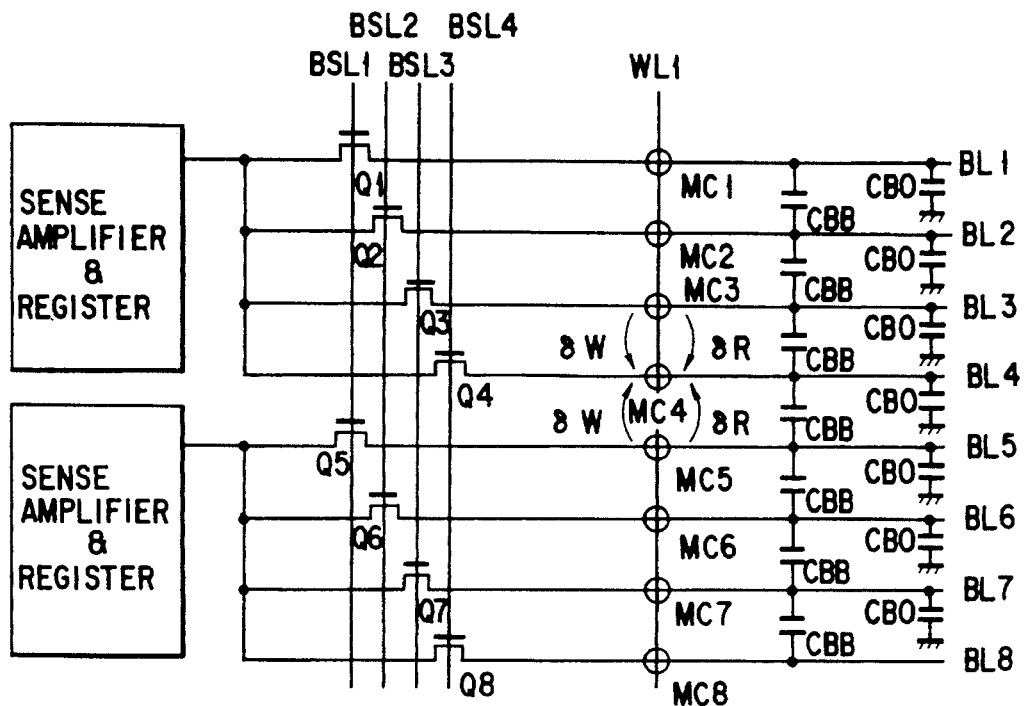
FIG. 9 is a diagram for illustrating the interference noise between the bit lines occurring in the conventional NAND type DRAM.

When data of the 4-bit cells connected to the word line WL11 are read out, the potential of the word line WL12 is set to the high voltage level with the potential of the word line WL11 kept at the high voltage level as explained in FIG. 8B. Then, in the same manner as a case for the word line WL11, data of 4-bit cells connected to the word line WL12 are read out, input to the fifth to eighth bits of the register and output to the I/O line.

The same operation is repeatedly effected for the word lines WL13, WL14, and data items of 16-bit cells in total are read out, are held in the register and are output to the I/O line.

During the above operation, the same operation is simultaneously effected for the bit line BL17 and succeeding bit lines, and if CSL12 and CSL13 are selected by the column decoder and set to the high voltage level, data is output to the I/O line, and if they are not selected, only the operation of holding data in the register is effected.

As is clearly shown in FIG. 28B, data of the memory cell connected to the bit line BL11 is never read out. The bit line BL11 acts only as a reference bit line of the bit line BL13. Likewise, the bit line BL24 of FIGS. 23 and 24 only acts as a reference bit line of the bit line BL22.

The re-writing operation is effected in the same manner as in the conventional case and in a reverse order of the readout operation.

The influence by the interference noise between the bit lines in this embodiment is explained with reference to FIGS. 28A and 28B. In the drawing, bit lines which make bit line pairs when memory cells are accessed are shown with solid lines. In this embodiment, bit lines which make pairs are not fixedly determined and a combination of the bit lines which make pairs is adequately changed according to a cell to be accessed.

For example, the bit line BL13 makes a pair with BL11 and the bit line BL14 makes a pair with BL12 in FIG. 28A, but the bit line BL13 makes a pair with BL15 and the bit line BL14 makes a pair with BL16 in FIG. 28B. Further, the bit line to which the memory cell is connected and whose potential varies when data is read out or written is always disposed between adjacent bit lines which are connected to the sense amplifier in a paired form.

Therefore, when data is read out from the cell, noise $\delta R$ is generated via the coupling capacitance CBB between the bit lines, but the noise generated from one bit line gives the same influence on the adjacent paired bit lines. The potential of the individual bit line is influenced by the noise $\Delta VN$ and changed, but the variation amount is the same in the paired bit lines. Consequently the potential difference between the paired bit lines after data readout is kept substantially unchanged. The sense amplifier senses and amplifies the voltage difference of the bit line pair, and therefore, it can be regarded that substantially no influence is given on the potential of the bit line by the noise.

In FIG. 28A, data is read out from the memory cell to the bit lines BL12 and BL13, the voltage thereof is changed, and the voltage variation causes noise on the adjacent bit lines via the coupling capacitors CBB between the bit lines. For example, the bit lines BL13 and BL11 receive substantially the same amount of noises from the bit line BL12, but since the two bit lines BL11 and BL13 make a bit line pair and the sense amplifier SA senses and amplifies a voltage difference between the bit lines. Even if the potentials of the bit lines receive the noises, the voltage difference therebetween is kept unchanged and is substantially not influenced by the noises because the amounts of the noises are equal to each other. This is also applied to all of the bit lines in the embodiment of FIGS. 23 and 24.

Also, the same effect can be attained in the writing or re-writing operation. For example, in the example of FIG. 28A, data is first written into a cell connected to the bit line BL13 and the cell is electrically connected to the bit line BL13. When data is next written into a cell connected to the bit line BL12, the bit line BL13 is set in the electrically floating state and kept in this condition. Therefore, as the potential of the bit line BL12 is changed by the writing operation, the BL13 receives noise δW by the coupling capacitor between the bit lines.

However, since the two bit lines BL12 and BL14 adjacent to the bit line BL13 make a bit line pair, noises on BL13 from the two bit lines cancel each other. The voltage of the bit line BL12 is changed from the original middle voltage level to a first power supply voltage level (VCC) or to a second power supply voltage level (VSS) according to data to be written. At the same time, the potential of the bit line BL14 which is one of the paired bit lines is changed from the middle voltage level to the second power supply voltage level or to the first power supply voltage level.

That is, the bit line BL13 receives noise of approximately +ΔVN (or −ΔVN) expressed in terms of the amount of noise given to data at the time of readout from one of the adjacent paired bit lines and receives noise of −ΔVN (or +ΔVN) of the opposite polarity from the other bit line. Therefore, the noises cancel each other and no influence by the noises appear on the bit line BL13. This is also applied to all of the bit lines in the embodiment of FIGS. 23 and 24.

Thus, according to this embodiment, the influence by the noise caused by the coupling capacitance between the bit lines at the data readout or writing time can be eliminated by use of the arrangement of the NAND cells shown in FIG. 25 and by changing of the bit line pair by use of the transfer transistors shown in FIGS. 23 and 24. That is, a NAND type DRAM which can be made free from the influence by the interference noise between the bit lines at the readout and writing time. The operation of the NAND type DRAM is extremely stable and the utility thereof is remarkable.

The eleventh embodiment of this invention is not limited to the above embodiment. In this embodiment, the NAND type DRAM having the memory cells arranged in the form of a cascadely cell is explained, but this embodiment is not limited to the above DRAM and can be applied to an OR type DRAM having memory cells arranged in the form of non-cascade cell. Further, The order of switching by the switching means for selecting the bit line and changing the bit line pair can be adequately changed according to the specification. In addition, this invention can be variously modified without departing from the technical scope thereof.

As described above, according to this invention, it is possible to provide a dynamic semiconductor memory device in which the influence by the interference noise between the bit lines at the writing or readout time can be eliminated by adequately and sequentially changing a combination of bit lines which make a bit line pair connected to the sense amplifier. The operation thereof margin can be extremely enlarged.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a plurality of bit lines constituting a plurality of bit-line pairs arranged such that every two pairs form a unit in which one of the bit lines of one pair extends between the bit lines of the other pair;
   a plurality of word lines;
   a plurality of memory cells connected to said bit lines under control of said word lines; and
   a plurality of sense amplifiers for detecting and amplifying a potential difference between the bit lines of any pair,
   wherein data from a memory cell is arranged to be transferred to only one of two bit lines which are located near and outside the bit lines of any pair when one word line is selected.

2. A semiconductor memory device according to claim 1, wherein each of said memory cells is so arranged such that it is connected to only one of two bit lines located near and outside a pair of bit lines, when one word line is selected.

3. A semiconductor memory device according to claim 1, wherein said memory cells constitute memory cell units, each comprised of a plurality of memory cells connected in series.

4. A semiconductor memory device according to any one of claims 1 to 3, wherein at least one of said word lines is selected to transfer data to the bit lines, and the number of word lines selected differs in accordance with memory cells into which data is to be written or from which data is to be read.

5. A semiconductor memory device according to claim 1, wherein said sense amplifier are provided in smaller numbers than said pairs of bit lines.

6. A semiconductor memory device according to claim 5, in which each of said sense amplifiers is provided for at least two pairs of bit lines, and which further comprises means for connecting one of at least two pairs of above bit lines thereto and disconnecting others of bit line pairs therefrom.

7. A semiconductor memory device comprising:
   a plurality of bit lines constituting a plurality of bit-line pairs;
   a plurality of word lines;
   a plurality of memory cells;
   a plurality of sense amplifiers for detecting and amplifying a potential difference between the bit lines of any pair, said sense amplifiers provided in smaller numbers than the pairs of bit lines, each for at least two pairs of bit lines;
   means for connecting one of at least two pairs of above bit lines thereto and disconnecting others of bit line pairs therefrom; and
   means for switching an order in which said pairs of bit lines are connected to said sense amplifier such that, of the bit lines connected to each sense amplifier and connected memory cells which are connected any selected word line and into and from which data is be written and read, a first bit line connected to the memory cell into which to write data first is located between a second bit line connected to the memory cell into which to write data next and a bit line which is complementary to the second bit line.

8. A semiconductor memory device according to claim 7, further comprising means for pre-charging each bit line to a precharge potential intermediate between alternative data-writing potentials "H" and "L" predetermined for said memory cells, immediately before data is written into any cell connected to said each bit line.

9. A semiconductor memory device according to claim 7, wherein said memory cells constitute memory cell units, each comprised of a plurality of memory cells connected in series.

10. A semiconductor memory device according to claim 8, wherein said memory cells constitute memory cell units, each comprised of a plurality of memory cells connected in series.

11. A semiconductor memory device according to any one of claims 7 to 10, wherein at least one of said word lines is selected to transfer data to the bit lines, and the number of word lines selected differs in accordance with memory cells into which data is to be written or from which data is to be read.

12. A dynamic semiconductor memory device comprising:
  a plurality of word lines;
  a plurality of bit lines;
  a plurality of memory cell units arranged on intersections between said plurality of word lines and said plurality of bit lines;
  a plurality of sense amplifiers each for sensing and amplifying the potential difference between two bit lines among said plurality of bit lines;
  first switching means for sequentially selecting bit lines among said plurality of bit lines which are connected to said sense amplifier in a paired form; and
  second switching means for changing the combination of the bit line pairs constructed by the bit lines selected by said first switching means;
  wherein two bit lines disposed adjacent to and on both sides of a bit line to which said memory cell unit is electrically connected to said sense amplifier in a paired form by said first and second switching means.

13. A dynamic semiconductor memory device according to claim 12, wherein a bit line electrically connected to said memory cell unit and two paired bit lines disposed adjacent to and on both sides of said bit line commonly use the same sense amplifier.

14. A dynamic semiconductor memory device according to claim 12, wherein said memory cell unit includes a plurality of memory cells serially connected.

15. A dynamic semiconductor memory device according to claim 13, wherein said memory cell unit is a NAND type DRAM cell which includes a plurality of memory cells serially connected.

16. A dynamic semiconductor memory device comprising:
  a plurality of bit lines intersecting a plurality of first word lines, a plurality of second word lines and a plurality of block word lines;
  a plurality of first NAND cells which are each constructed by a first preset number of series-connected memory cells among a plurality of memory cells connected to said first word lines and which are each connected to a corresponding one of said bit lines via one of switching elements whose conduction state is controlled by said block word line;
  a plurality of second NAND cells which are each constructed by a second preset number of series-connected memory cells among a plurality of memory cells connected to said second word lines and which are each connected to a corresponding one of said bit lines via one of switching elements whose conduction state is controlled by said block word line;
  a plurality of third NAND cells which are each constructed by a first preset number of series-connected memory cells among a plurality of memory cells connected to said first word lines and which are each directly connected to a corresponding one of said bit lines;
  a plurality of fourth NAND cells which are each constructed by a second preset number of series-connected memory cells among a plurality of memory cells connected to said second word lines and which are each directly connected to a corresponding one of said bit lines;
  a plurality of sense amplifiers each for sensing and amplifying a potential difference between two of said plurality of bit lines; and
  switching means for connecting said plurality of bit lines to corresponding ones of said sense amplifiers;
  wherein said first NAND cells are disposed on intersections between said first word lines and the (4k−3)th (k is a positive integer) and 4k-th bit lines, said second NAND cells are disposed on intersections between said second word lines and the (4k−2)th and (4k−1)th bit lines, said third NAND cells are disposed on intersections between said first word lines and the (4k−2)th and (4k−1)th bit lines, and said fourth NAND cells are disposed on intersections between said second word lines and the (4k−3)th and 4k-th bit lines, and when i-th NAND cells are electrically connected to corresponding one of bit lines, said switching means connects said plurality of bit lines to corresponding ones of said sense amplifiers to make a bit line pair by a bit line connected to one of two adjacent i-th (i=1, 2, 3, 4) NAND cells and a bit line disposed on an opposite side of said bit line connected to one of two adjacent i-th NAND cells with respect to a bit line connected to said i-th NAND cells.

17. A dynamic semiconductor memory device according to claim 16, wherein a plurality of bit line pairs including a plurality of bit lines to which said adjacent two i-th NAND cells are connected commonly use the same sense amplifier.

* * * * *